(12) United States Patent
Whitaker et al.

(10) Patent No.: US 6,993,731 B2
(45) Date of Patent: Jan. 31, 2006

(54) OPTIMIZATION OF DIGITAL DESIGNS

(75) Inventors: Sterling R. Whitaker, Albuquerque, NM (US); Lowell H. Miles, Albuquerque, NM (US)

(73) Assignee: Science & Technology Corporation @ UNM, Albuquerque, NM (US)

( * ) Notice: Subject to any disclaimer, the term of this patent is extended or adjusted under 35 U.S.C. 154(b) by 228 days.

(21) Appl. No.: 10/172,746

(22) Filed: Jun. 14, 2002

(65) Prior Publication Data

US 2003/0177457 A1   Sep. 18, 2003

Related U.S. Application Data

(60) Provisional application No. 60/298,832, filed on Jun. 15, 2001.

(51) Int. Cl.
   *G06F 17/50*   (2006.01)
(52) U.S. Cl. ................. 716/3; 716/2; 716/18
(58) Field of Classification Search ........ 716/2–5, 716/17, 18, 1, 19
   See application file for complete search history.

(56) References Cited

U.S. PATENT DOCUMENTS

| | | | |
|---|---|---|---|
| 5,040,139 A | 8/1991 | Tran | |
| 5,051,917 A | 9/1991 | Gould et al. | |
| 5,162,666 A | 11/1992 | Tran | |
| 5,200,907 A | 4/1993 | Tran | |
| 5,225,991 A | 7/1993 | Dougherty | |
| 5,349,659 A | 9/1994 | Do et al. | |
| 5,432,707 A * | 7/1995 | Leung | 716/2 |
| 5,526,276 A | 6/1996 | Cox et al. | |
| 5,548,231 A | 8/1996 | Tran | |
| 5,572,437 A * | 11/1996 | Rostoker et al. | 716/18 |
| 5,596,742 A | 1/1997 | Agarwal et al. | |
| 5,649,165 A | 7/1997 | Jain et al. | |
| 5,712,806 A | 1/1998 | Hennenhoefer et al. | |
| 5,780,883 A | 7/1998 | Tran et al. | |
| 5,796,128 A | 8/1998 | Tran et al. | |
| 5,805,462 A | 9/1998 | Poirot et al. | |
| 5,859,547 A | 1/1999 | Tran et al. | |
| 5,894,227 A | 4/1999 | Acuff | |
| 5,910,897 A * | 6/1999 | Dangelo et al. | 716/19 |
| 5,953,519 A | 9/1999 | Fura | |
| 5,987,086 A | 11/1999 | Raman et al. | |
| 6,051,031 A | 4/2000 | Shubat et al. | |
| 6,148,436 A * | 11/2000 | Wohl | 716/18 |

(Continued)

FOREIGN PATENT DOCUMENTS

WO   WO 02/103757   12/2002

OTHER PUBLICATIONS

Devadas, S. Optimal Layout Via Boolean Satisfiability, 1989 IEEE International Conference on Computer-Aided Design Nov. 5, 1989, pp. 294-297.

(Continued)

*Primary Examiner*—Thuan Do
(74) *Attorney, Agent, or Firm*—Townsend and Townsend and Crew LLP

(57) ABSTRACT

An application specific integrated circuit is optimized by translating a first representation of its digital design to a second representation. The second representation includes multiple syntactic expressions that admit a representation of a higher-order function of base Boolean values. The syntactic expressions are manipulated to form a third representation of the digital design.

28 Claims, 18 Drawing Sheets

U.S. PATENT DOCUMENTS

| | | | |
|---|---|---|---|
| 6,173,435 B1 | 1/2001 | Dupenloup | |
| 6,184,718 B1 | 2/2001 | Tran et al. | |
| 6,185,719 B1 | 2/2001 | Sako | |
| 6,205,572 B1 | 3/2001 | Dupenloup | |
| 6,263,483 B1 | 7/2001 | Dupenloup | |
| 6,275,973 B1 | 8/2001 | Wein | |
| 6,282,695 B1 | 8/2001 | Reddy et al. | |
| 6,286,128 B1 * | 9/2001 | Pileggi et al. | 716/18 |
| 6,288,593 B1 | 9/2001 | Tran et al. | |
| 6,289,491 B1 | 9/2001 | Dupenloup | |
| 6,289,498 B1 | 9/2001 | Dupenloup | |
| 6,292,931 B1 | 9/2001 | Dupenloup | |
| 6,295,636 B1 | 9/2001 | Dupenloup | |
| 6,356,112 B1 | 3/2002 | Tran et al. | |
| 6,378,123 B1 * | 4/2002 | Dupenloup | 716/18 |
| 6,467,074 B1 | 10/2002 | Katsioulas et al. | |
| 6,526,543 B1 * | 2/2003 | Rosser | 716/2 |
| 2002/0069396 A1 | 6/2002 | Bhattacharya et al. | |
| 2002/0087939 A1 | 7/2002 | Greidinger et al. | |
| 2003/0145288 A1 * | 7/2003 | Wang et al. | 716/2 |

OTHER PUBLICATIONS

Falkowski, B.J. et al., Efficient Algorithms For the Calculation of Arithmetic Spectrum from OBDD and Synthesis of OBDD from Arithmetic Spectrum for Incompletely Specified Boolean Functions 1994 IEEE International Symposium on Circuits and Systems, May 30, 1994, vol. 1, pp. 197-200.

Method for Identifying Technology Primitive in Logic IBM Technical Disclosure Bulletin, May 1992 Vo. 34, No. 12, pp. 359-361.

Upton, M. et al. Integrated Placement for Mixed Macro Cell and Standard Cell Designs Proceedings of 27th ACM/IEEE Design Automation Conference, Jun. 24, 1990, pp. 32-35.

Yano, Kazuo, et al., "Lean Integration: Achieving a Quantum Leap in Performance and Cost of Logic LSIs," IEEE 1994 Custom Integrated Circuits Conference, pp. 603-606.

Fletcher, William I., *An Engineering Approach to Digital Design*, MSI and LSI Circuits and Their Applications, 1980, Prentice-Hall, Inc., Englewood Cliffs, NJ, pp. 210-226.

* cited by examiner

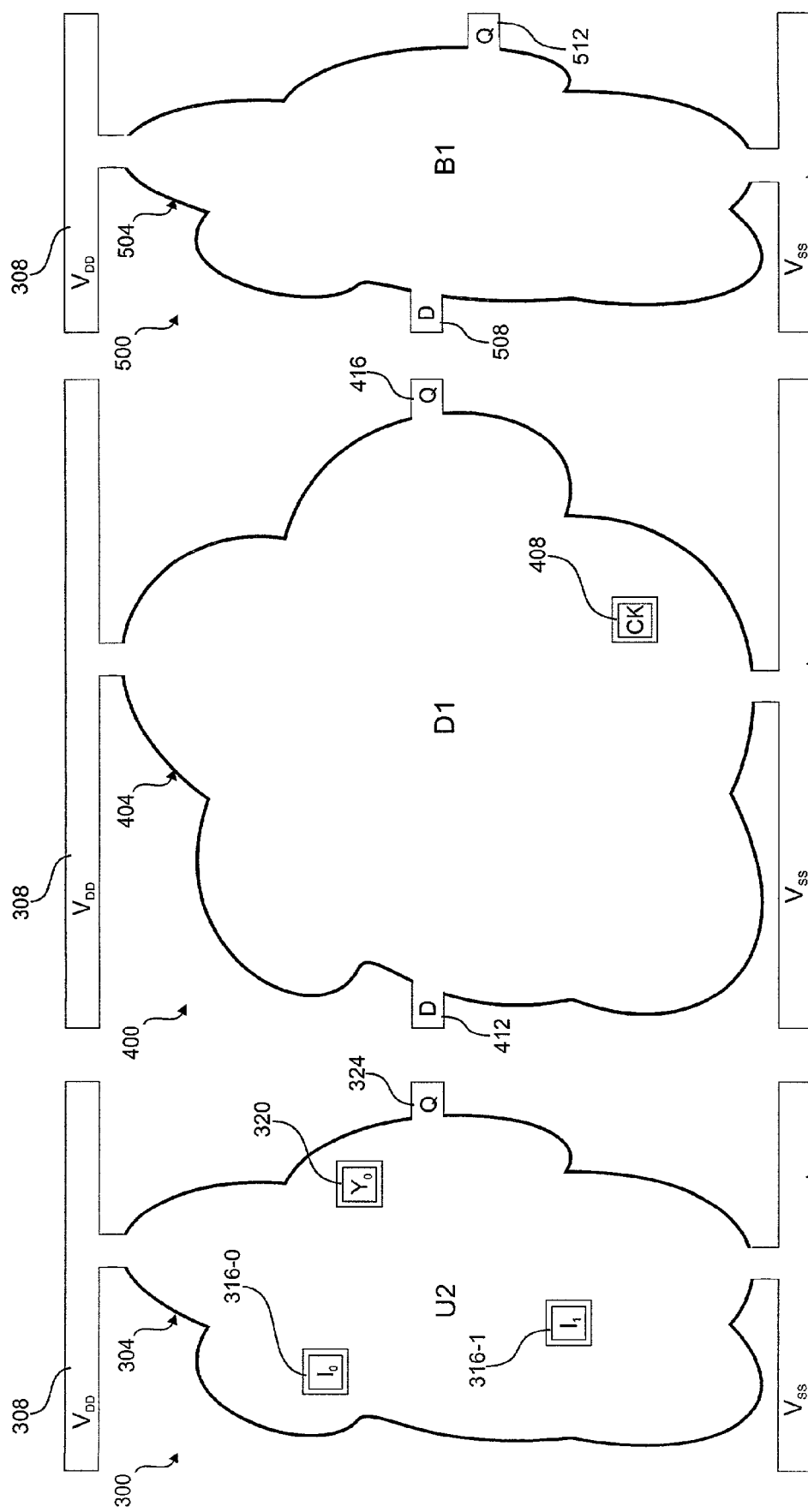

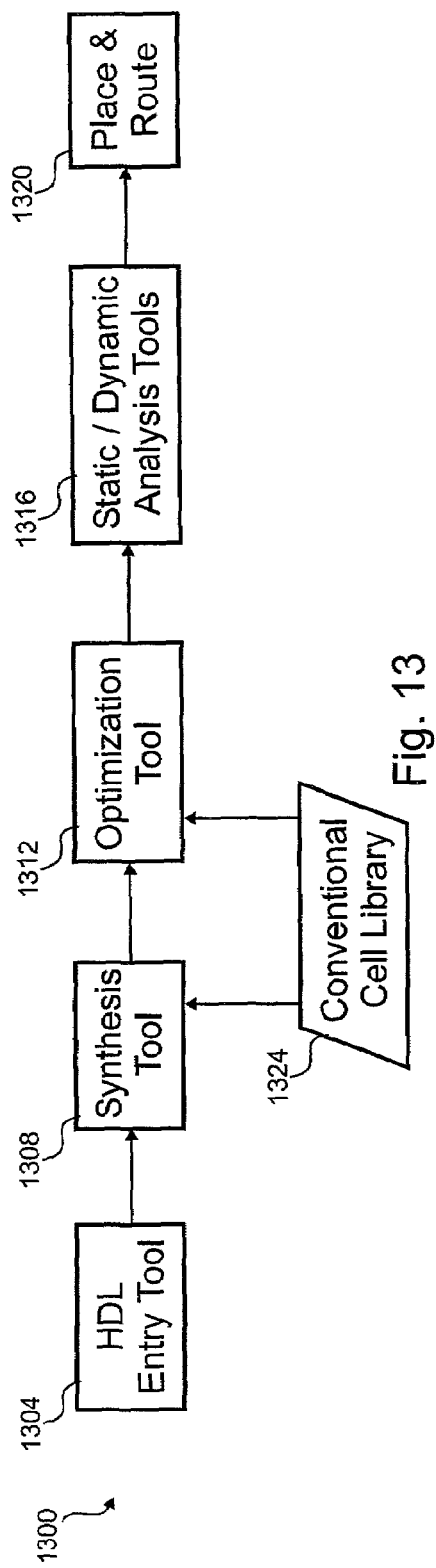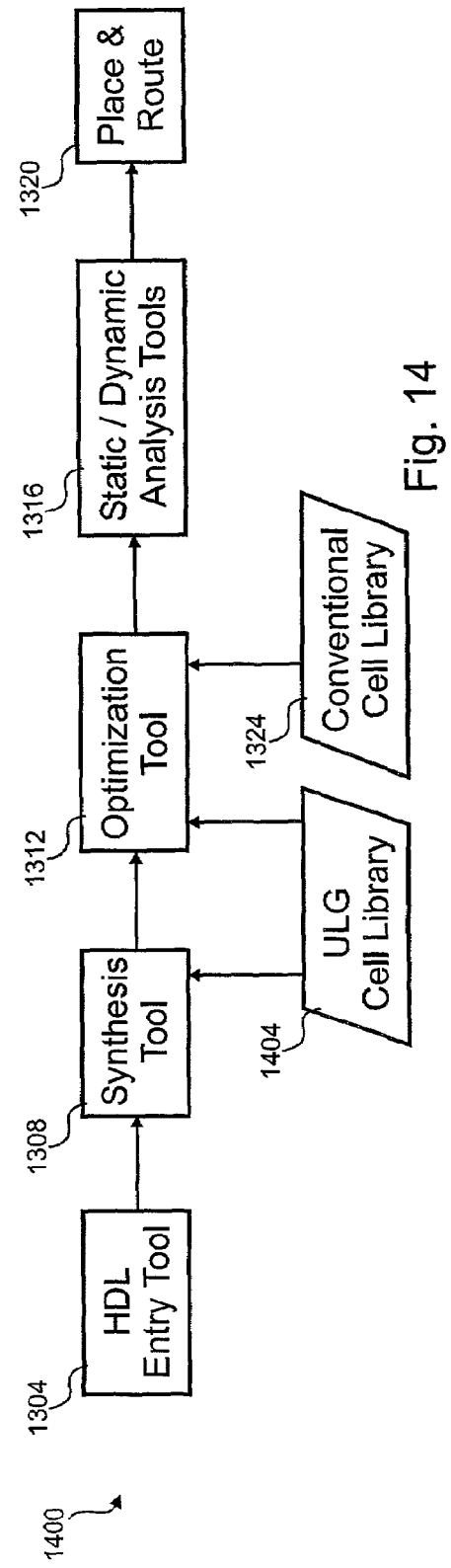

OPTIMIZATION OF DIGITAL DESIGNS

CROSS-REFERENCES TO RELATED APPLICATIONS

This application is a nonprovisional of and claims priority to U.S. Provisional Patent Application No. 60/298,832 entitled "MULTIPLEXOR-BASED DIGITAL DESIGN," filed Jun. 15, 2001 by Sterling R. Whitaker et al., the entire disclosure of which is herein incorporated by reference for all purposes.

This application is also related to the following commonly assigned, concurrently filed U.S. patent applications, each of which is also incorporated herein by reference in its entirety for all purposes: U.S. patent application Ser. No. 10/172,742, entitled "PASS-TRANSISTOR VERY LARGE SCALE INTEGRATION," by Gary K. Maki and Prakash R. Bhatia U.S. patent application Ser. No. 10/172,746, entitled "OPTIMIZATION OF DIGITAL DESIGNS," by Sterling R. Whitaker and Lowell H. Miles; U.S. patent application Ser. No. 10/172,745, entitled "INTEGRATED CIRCUIT CELL LIBRARY," by Sterling R. Whitaker and Lowell H. Miles; Ser. No. 10/172,743, entitled "DIGITAL LOGIC OPTIMIZATION USING SELECTION OPERATIONS," by Sterling R. Whitaker, Lowell H. Miles, Eric G. Cameron, and Jody W. Gambles; and U.S. patent application Ser. No. 10/172,744, entitled "DIGITAL CIRCUITS USING UNIVERSAL LOGIC GATES," by Sterling R. Whitaker, Lowell H. Miles, Eric G. Cameron, Gregory W. Donohoe, and Jody W. Gambles. These applications are sometimes referred to herein as "the Universal-Logic-Gate applications."

BACKGROUND

This invention relates in general to digital circuits and, more specifically, to design of digital circuits that are laid-out with cells.

Mathematics is one attempt for humankind to understand the universe around them. As technological advancement occurs, mathematical concepts and algorithms grow to enable and/or support those advancements. Within the context of digital design, Boolean logic is the mathematical construct used to manipulate and optimize digital circuits. Nearly every electronic device today relies upon some type of Boolean logic for any embedded digital circuits. Other mathematical constructs, however, are possible that allow further optimization of digital designs. Changes to the processing of digital design are necessary when avoiding Boolean logic elements.

Today application specific integrated circuit (ASIC) are specified using netlists of library cells for a particular process of a foundry or fabrication facility. These netlists are used to fabricate integrated circuits made up of the library cells. A few hundred library cells are typically available for a particular process that include AND gates, OR gates, flip-flops (F/F), and buffers. When a new fabrication process is developed, engineers custom layout each of the library cells to get the most optimal performance from each cell.

BRIEF DESCRIPTION OF THE DRAWINGS

The present invention is described in conjunction with the appended figures:

FIG. 3 is a block diagram of an embodiment of a universal logic gate layout;

FIG. 4 is a block diagram of an embodiment of a memory kernel cell layout;

FIG. 5 is a block diagram of an embodiment of a buffer kernel cell layout;

FIG. 13 is a block diagram of an embodiment of a design flow that uses syntactic manipulation after synthesis;

FIG. 14 is a block diagram of another embodiment of a design flow that uses syntactic manipulation and the ULG ASIC cell library;

Figure 1A:
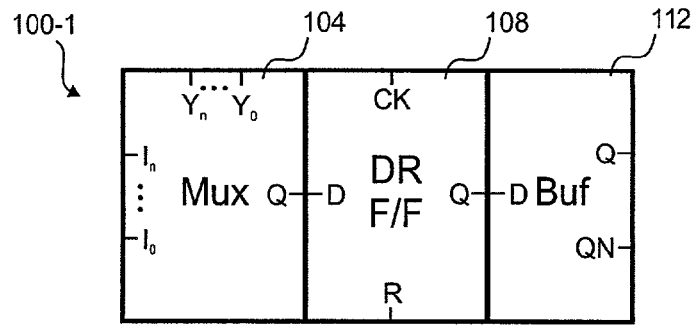
FIG. 1A is a block diagram of an embodiment of a basic cell composed of kernel cells.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s) only, and is not intended to limit the scope, applicability or configuration of the invention. Rather, the ensuing description of the preferred exemplary embodiment(s) will provide those skilled in the art with an enabling description for implementing a preferred exemplary embodiment of the invention. It is to be understood that various changes may be made in the function and arrangement of elements without departing from the spirit and scope of the invention as set forth in the appended claims.

In some embodiments, a method is provided for optimizing an application specific integrated circuit. A first representation of a digital design for the circuit is translated to a second representation of the digital design. The second representation comprises a plurality of syntactic expressions that admit a representation of a higher-order function of base Boolean values. The plurality of syntactic expressions are manipulated to form a third representation of the digital design. In some embodiments, the third representation is translated to a fourth representation of the digital design, with the first and fourth representations expressed in the same syntax. For example, the common syntax may correspond to netlist representations. In some instances, manipulation of the syntactic expressions is aided by identifying data and control in the first and/or second representations. Examples of manipulations include removing logical inversions, reducing a number of nodes, and reassigning data and control.

The methods of the present invention may be embodied in a computer-readable storage medium having a computer-readable program embodied therein for directing operation of a computer system. Such a computer system may include a communications system, a processor, and a storage device. The computer-readable program includes instructions for operating the computer system as part of optimizing a digital design in accordance with the embodiments described above.

I. Cells

In one embodiment, a basic cell is a construct that includes one or more of a universal logic gate (ULG), a memory element or flip-flop (F/F), and/or a buffer. In this embodiment, the ULG is a multiplexor or select circuit. The ULG, memory element, and buffer are implemented with a relatively-small number of kernel cells, which typically have layouts that are individually optimized, and often, by hand. The kernel cells are arranged into the higher-level basic cells having at least one of the ULG, memory element, and buffer, but the basic cells do not have more than one of any type of kernel cell in this embodiment. For a given semiconductor process, there is a ULG ASIC cell library which is composed of the basic cells and specialized cells. These specialized cells may differ from the basic cell construct and could include, for example, clock dividers, memory arrays, analog circuits, phase-locked loops, oscillators, analog circuits, etc.

Referring first to FIG. 1A, an embodiment of a basic cell 100 is shown in block diagram form. This embodiment includes all three of a ULG or selection circuit 104, a memory cell 108 and a buffer 112. Some of the kernel cell components of the basic cell 100 are shown in a generalized manner. The ULG 104 is shown having any number of data and selection control inputs, however the relationship between the maximum data inputs for a number of selection control inputs follows the following relationship $2^y=I$. The memory kernel cell 108 shown is a resetable D F/F. A buffer kernel cell 112 shown has both an inverting and non-inverting output, although, other buffer implementations will have either an inverting or non-inverting output.

The ULG 104 in this embodiment is implemented with a multiplexor. Multiplexors can be used to implement any Boolean function, but are not Boolean operators. Combinatorial logic in conventional designs is not implemented with selection functions, but uses Boolean logic gates. Further, multiplexors in conventional circuits are converted to Boolean equivalents during synthesis.

The below Table I shows the fourteen kernel cells used in one embodiment:

TABLE I

| ULG Component | Symbol | Description |
| --- | --- | --- |
| ULG | U | 8 to 1 (U8), 4 to 1 (U4) or 2 to 1 (U2) Multiplexors |
| Memory Cells | D | D F/F (D1) |
|  | DR | Resetable D F/F—Synchronous (DR1), Clock Edge Synchronization (DR2) or Asynchronous (DR3) |
|  | DS | Setable D F/F—Synchronous (DS1), Clock Edge Synchronization (DS2) or Asynchronous (DS3) |
| Buffers | B | Non-inverting buffer (B1) or Hybrid Inverting and Non-inverting buffer (B2) |
|  | BN | Inverting buffer (BN1) |
|  | CB | High-drive buffer (CB1) |
|  | ZB | Tristatable buffer (ZB1) |

The embodiment of the kernel cells in the above Table I could be augmented in other embodiments to include other cells. The ULGs could include multiplexors of any size, for example, 16 to 1, 32 to 1, 64 to 1, etc. Larger multiplexors could be formed with a number of smaller multiplexors if a larger multiplexor is not supported in the kernel cells. Various other types of memory cells could also be supported such as EEPROM, EPROM, PROM, DRAM, SRAM, NVRAM, magnetic core memory, J-K F/Fs, setable and resetable F/Fs, various F/F with scan ATPG capability, etc. The J-K, setable, or resetable functionality of a F/F can be implemented by a D F/F and logic that can be embedded in the mux before or after the D F/F. The F/Fs could also be falling edge triggered in some embodiments. Also the buffers could be of various strengths and sizes. Some buffers could support input and output pins of the chip with various thresholds, voltages, etc.

Table II lists the various configurations in which kernel cells are used to create basic cells 100-1 that use all of a ULG 104, a memory cell 108 and a buffer cell 112 such as the example in FIG. 1A. These basic cells 100-2 are the variations found in one embodiment of the ULG ASIC cell library.

TABLE II

| Basic Cell Type | Configuration Mux → Mem → Buf | Various Basic Cell Layout Names |
|---|---|---|
| UDB | U → D → B | U2D1B1, U4D1B1, U8D1B1, U2D1B2, U4D1B2, U8D1B2, |
| UDBN | U → D → BN | U2D1BN1, U4D1BN1, U8D1BN1 |
| UDZB | U → D → ZB | U2D1ZB1, U4D1ZB1, U8D1ZB1 |
| UDRB | U → DR → B | U2DR1B1, U2DR2B1, U2DR3B1, U2DR1B2, U2DR2B2, U2DR3B2, U4DR1B1, U4DR2B1, U4DR3B1, U4DR1B2, U4DR2B2, U4DR3B2, U8DR1B1, U8DR2B1, U8DR3B1, U8DR1B2, U8DR2B2, U8DR3B2 |
| UDRBN | U → DR → BN | U2DR1BN1, U2DR2BN1, U2DR3BN1, U4DR1BN1, U4DR2BN1, U4DR3BN1, U8DR1BN1, U8DR2BN1, U8DR3BN1 |
| UDRZB | U → DR → ZB | U2DR1ZB1, U2DR2ZB1, U2DR3ZB1, U4DR1ZB1, U4DR2ZB1, U4DR3ZB1, U8DR1ZB1, U8DR2ZB1, U8DR3ZB1 |
| UDSB | U → DS → B | U2DS1B1, U2DS2B1, U2DS3B1, U2DS1B2, U2DS2B2, U2DS3B2, U4DS1B1, U4DS2B1, U4DS3B1, U4DS1B2, U4DS2B2, U4DS3B2, U8DS1B1, U8DS2B1, U8DS3B1, U8DS1B2, U8DS2B2, U8DS3B2 |
| UDSBN | U → DS → BN | U2DS1BN1, U2DS2BN1, U2DS3BN1, U4DS1BN1, U4DS2BN1, U4DS3BN1, U8DS1BN1, U8DS2BN1, U8DS3BN1 |
| UDSZB | U → DS → ZB | U2DS1ZB1, U2DS2ZB1, U2DS3ZB1, U4DS1ZB1, U4DS2ZB1, U4DS3ZB1, U8DS1ZB1, U8DS2ZB1, U8DS3ZB1 |

Figure 1B:
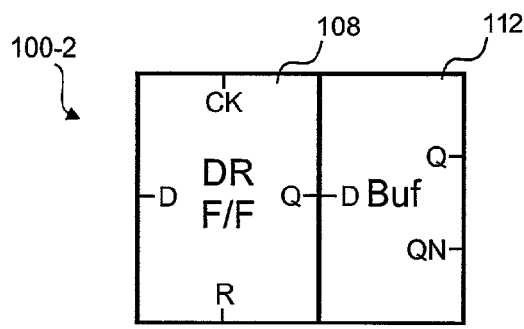
FIG. 1B is a block diagram of another embodiment of a basic cell composed of a memory and a buffer kernel cells.

With reference to FIG. 1B, a block diagram of another embodiment of a basic cell 100-2 composed of memory and buffer kernel cells 108, 112 is shown. This is but one example of a basic cell 100-2 of this general configuration. Other basic cells of this general configuration that could be found in an embodiment of a ULG ASIC cell library are listed in Table III.

TABLE III

| Basic Cell Type | Configuration Memory → Buffer | Various Basic Cell Layout Names |
|---|---|---|
| DB | D → B | D1B1, D1B2 |
| DBN | D → BN | D1BN1 |
| DZB | D → ZB | D1ZB1 |
| DRB | DR → B | DR1B1, DR2B1, DR3B1, DR1B2, DR2B2, DR3B2 |
| DRBN | DR → BN | DR1BN1, DR2BN1, DR3BN1 |
| DRZB | DR → ZB | DR1ZB1, DR2ZB1, DR3ZB1 |
| DSB | DS → B | DS1B1, DS2B1, DS3B1, DS1B2, DS2B2, DS3B2 |
| DSBN | DS → BN | DS1BN1, DS2BN1, DS3BN1 |
| DSZB | DS → ZB | DS1ZB1, DS2ZB1, DS3ZB1 |

Figure 1C:
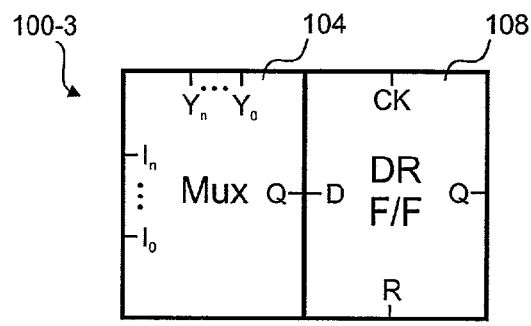
FIG. 1C is a block diagram of yet another embodiment of a basic cell composed of a selection and memory kernel cells.

Referring next to FIG. 1C, a block diagram of yet another embodiment of a basic cell 100-3 is shown that is composed of ULG and memory kernel cells 104, 108. This is just one example of the various similar basic cells 100-3 that might form an embodiment of the ULG ASIC cell library. Other possible configurations are enumerated in Table IV below.

TABLE IV

| Basic Cell Type | Configuration Mux → Mem | Various Basic Cell Layout Names |
|---|---|---|
| UD | U → D | U2D1, U4D1, U8D1 |
| UDR | U → DR | U2DR1, U4DR1, U8DR1, U2DR1, U4DR2, U8DR2, U2DR3, U4DR3, U8DR3 |

TABLE IV-continued

| Basic Cell Type | Configuration Mux → Mem | Various Basic Cell Layout Names |
|---|---|---|
| UDS | U → DS | U2DS1, U4DS1, U8DS1, U2DS2, U4DS2, U8DS2, U2DS3, U4DS3, U8DS3 |

Figure 1D:
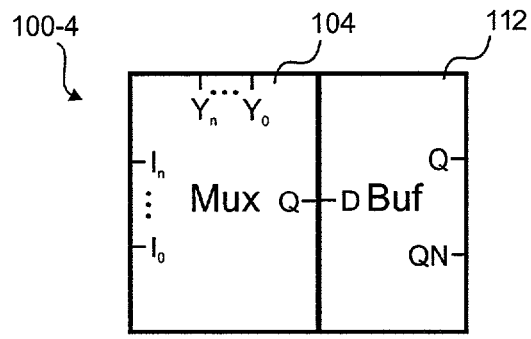
FIG. 1D is a block diagram of still another embodiment of a basic cell composed of a selection and a buffer kernel cells.

With reference to FIG. 1D, a block diagram of still another embodiment of a basic cell 100-4 composed of ULG and buffer kernel cells 104, 112 is shown. There are other possible configurations of this type of basic cell 100-4. The variations of this basic cell 100-4 for one embodiment of the ASIC library are listed in Table V. From Tables II–V, around 80% of the 142 available basic cells include ULG circuits. The 142 basic cells are based upon the 14 kernel cells of Table I.

Although the embodiment in Tables II–V show some possible basic cells, other embodiments could include additional basic cells. These additional basic cells could be optimized for output power, power consumption, layout area, response time, leakage, etc. such that there are multiple cells with the same logical properties, but that are optimized for particular circumstances. For example, there may be three non-inverting buffers of having different drives to support larger fanout and/or higher speeds. In various embodiments, there could be less than, for example, 100, 75, 50, 40, 30, 20, or 10 kernel cells. At the lower limit, there is three kernel cells in one embodiment with just one of each of the types of kernel cells.

TABLE V

| Basic Cell Type | Configuration Mux → Buf | Various Basic Cell Layout Names |
|---|---|---|
| UB | U → B | U2B1, U4B1, U8B1, U2B2, U4B2, U8B2 |
| UBN | U → BN | U2BN1, U4BN1, U8BN1 |

The building blocks of a digital circuit could be abstracted beyond the ULG ASIC cell library. In some embodiments, the ULG ASIC cell library components could be combined in higher-level macro cells such as adders, multipliers, registers, barrel shifters, ALUs, comparators, decoders, state machines, counters, etc. There could be thousands of possible macro cells. Further, designs can be abstracted to a level higher than the macro cells by using cores that implement higher level functions such as microprocessors, graphics processors, interface busses or ports, digital signal processors, etc. These cores could use macro cells and/or components from the ULG ASIC cell library. Often the cores are written in a hardware description language (HDL) that can be easily synthesized into any ULG ASIC cell library for a particular process.

Figure 2A:
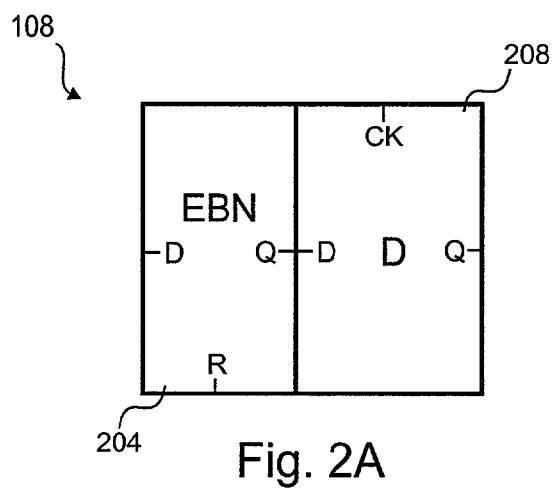
FIG. 2A is a block diagram of an embodiment of a memory cell with a synchronous reset.
Figure 2B:
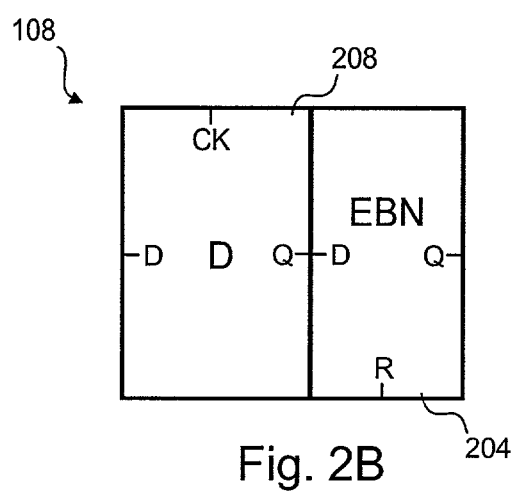
FIG. 2B is a block diagram of another embodiment of a memory cell with an asynchronous reset.

With reference to FIGS. 2A and 2B, various embodiments of a memory kernel cell 108 are shown in block diagram form. These embodiments divide the D F/F 208 out from the memory cell and implement some functionality with a separate buffer cell 204. In various embodiments, the buffer cell 204 could be used to customize the D F/F 208 with synchronous reset of FIG. 2A or asynchronous reset of FIG. 2B. In other embodiments, a separate circuit could be used to make a D F/F 208 behave as a setable D F/F, a J-K F/F or a F/F with scan capability. In other embodiments, the separate circuit could be implemented with a selection circuit.

This buffer cell 204 in an ASIC cell library could be used for other purposes also. For example, an 8 to 1 mux function could be implemented with a buffer cell 204 and a 4 to 1 mux 104 in some circumstances to reduce the chip area needed to implement the functionality. Table VI shows the thirteen kernel cells used in this embodiment. Table VII shows a truth table for the enable buffer 204 where the enable input is R, the input is D and the output is Q.

TABLE VI

| Kernel Cell Component | Symbol | Description |
|---|---|---|
| ULGs | U | 8 to 1 (U8), 4 to 1 (U4) or 2 to 1 (U2) Multiplexors |
| Memory Cells | D | D F/F (D1) |
|  | DS | Setable D F/F—Synchronous (DS1), Clock Edge Synchronization (DS2) or Asynchronous (DS3) |
| Buffers | B | Non-inverting buffer (B1) or Hybrid Inverting and Non-inverting buffer (B2) |
|  | BN | Inverting buffer (BN1) |
|  | EBN | Inverting buffer with an enable input (EBN1) |
|  | CB | High-drive buffer (CB1) |
|  | ZB | Tristatable buffer (ZB1) |

TABLE VII

| R | D | Q |
|---|---|---|
| 0 | 0 | 1 |
| 0 | 1 | 1 |
| 1 | 0 | 1 |
| 1 | 1 | 0 |

II. Layout of Cells

Each fabrication process at a fab or foundry generally has a conventional ASIC cell library that is customized for that process. Each of the hundreds of cells in the conventional ASIC cell library is typically manually laid out to optimize its configuration. In this embodiment, however, a small number of customized kernel cells are used to automatically or manually compile the basic cells 100. For a target fabrication process, care is taken to optimize the layout of kernel cells 104, 108, 112 for factors such as power consumption, chip area, number of masks, number of process steps, yield, capacitance, inductance, resistance, glitches, I/O placement, etc. In some cases, the fabrication processes are similar enough to other fabrications processes that only minor tweaking to kernel cells is done.

With reference to FIG. 3 a block diagram of an embodiment of a ULG layout 300 is shown. A cloud graphic is used to represent the layout of the circuit to implement the 2 to 1 ULG 104. Input ports 316, 320 and I/O 324 are detailed within the circuit cloud, more specifically, ports for the inputs ($I_0$ and $I_1$) 316 and the select ($Y_0$) 320 and a trace is shown for the Q output 324. For the ULG kernel cell, the input and select signals are ports 316, 320 within the ULG layout 300. The ULG circuit 304 is attached by traces to latitudinal power traces 308, 312.

Abutment is used to link certain signals by coupling adjacent kernel cells. Adjacent placement of the cells may join the abutted I/O or a small conductive trace may join the abutted I/O. The kernel cells have a uniform height and differing depths such that the power traces 308, 312 for each kernel cell align with the next kernel cell. Also, certain I/O signals use a uniform latitude. For example the Q output 324 of the ULG layout 304 would align latitudinally with an input for an adjacent memory or buffer kernel cell.

Referring next to FIG. 4, a block diagram of an embodiment of a memory kernel cell layout 400 is shown. This memory circuit 404 implements a D F/F with a D input 412, a clock input 408 and a Q output 416. Coupled to the memory circuit 404 are a $V_{DD}$ and $V_{ss}$ power busses 308, 312. The height of the memory kernel cell layout 400 is the same as the ULG cell layout 300 such that the power busses for both kernel cells align latitudinally.

With reference to FIG. 5, a block diagram of an embodiment of a buffer kernel cell layout 500 is shown. As with the other kernel cell circuits 304, 404, a non-inverting buffer kernel cell circuit 504 is coupled to power busses 308, 312 with a height uniform to the other kernel circuits 304, 404. The buffer circuit includes a D input 508 and a Q output 512, where the D input 508 is latitudinally aligned with the outputs from either a ULG circuit 304 or a memory circuit 404. In this embodiment, the Q output 512 is offset from the latitude of the D input 508.

Figure 6:
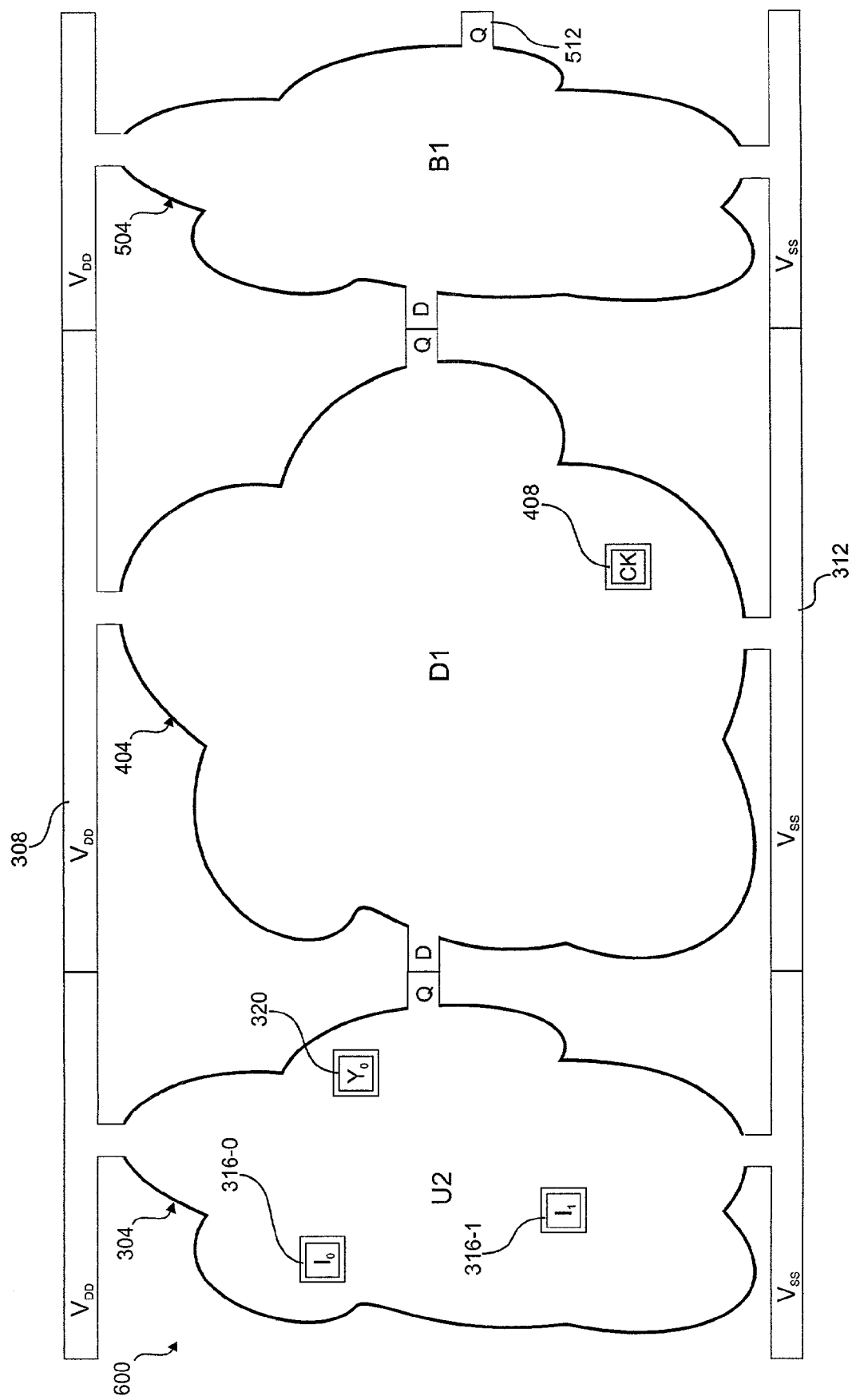
FIG. 6 is a block diagram of an embodiment of a basic cell abutted together from the kernel cells of FIGS. 3–5.

Referring next to FIG. 6, a block diagram of an embodiment of a basic cell 600 abutted together from three kernel cells 300, 400, 500 is shown. A U2 ULG, D1 F/F and B1 non-inverting buffer kernel cells 300, 400, 500 are connected in serial to form the basic cell 600. The power busses 308, 312 for each kernel cell 300, 400, 500 align to form a larger whole. The Q output 324 from the U2 ULG circuit 304 aligns with the D input 412 to the D1 memory circuit 404, and the Q output 416 from the D1 memory circuit 404 aligns with the D input 508 to the B1 buffer circuit 504. Other embodiments could have additional power busses, for example, a substrate bus connection.

Figure 7:
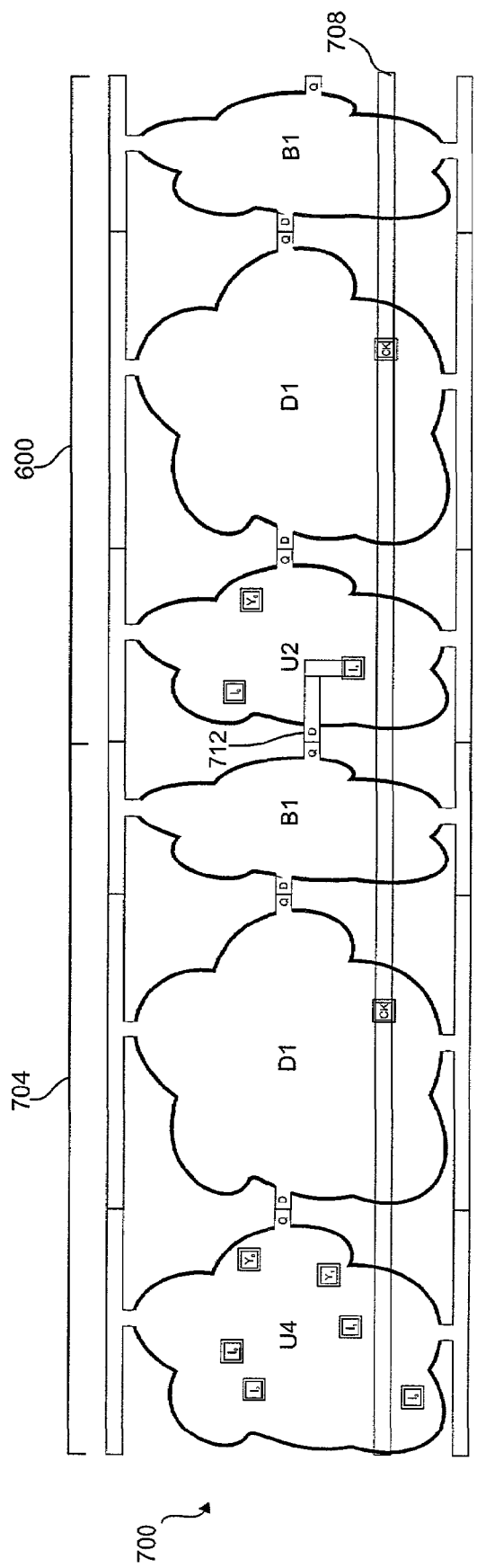
FIG. 7 is a block diagram of an embodiment of two basic cells laid out together.

With reference to FIG. 7, a block diagram of an embodiment of two basic cells 600, 704 laid out together in a row 700 is shown. During layout of a chip, all the ULG ASIC cells are arranged. The basic cells 600, 704 are aligned in horizontal rows. In some cases (not depicted), there is routing of one or more signals between the basic cells 600, 704. In the depicted embodiment, an output from a first basic cell 704 is coupled with a trace 712 to an input of a second basic cell 600. The clock inputs for both basic cells 600, 704 are latitudinally aligned such that a clock bus can pass strait across a row 700 of basic cells.

Figure 8A:
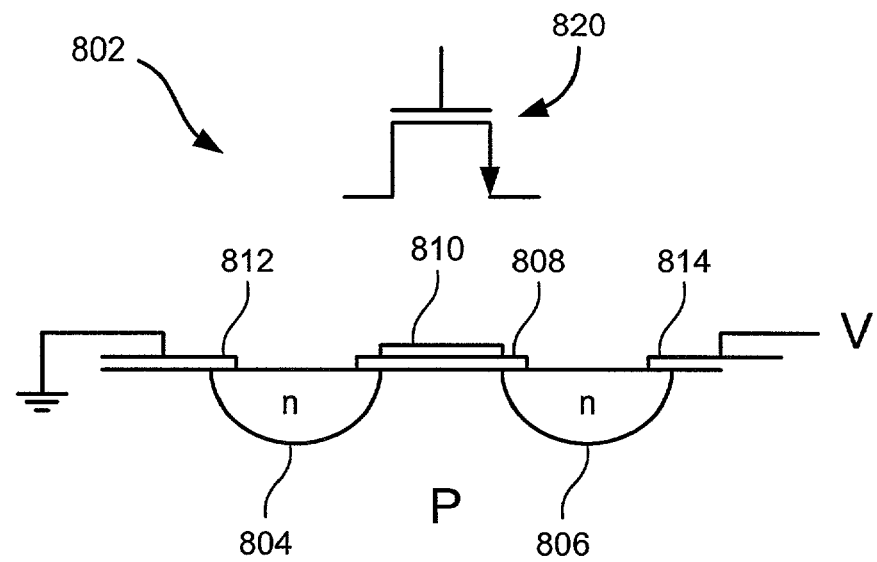
FIG. 8A provides a schematic illustration of an enhancement-mode transistor.

In some embodiments, additional size reductions are realized in the ULGs by having them comprise one or more depletion-mode transistors. Schematic diagrams are provided in FIGS. 8A and 8B that compare enhancement-mode and depletion-mode transistors. FIG. 8A shows the structure of an n-type enhancement-mode transistor 802 that comprises a source 804, a drain 806, and a gate 810. Connections are made with the source 804 and drain 806 respectively through pads 812 and 814. The gate 810 usually comprises a metal formed over an oxide such as $SiO_2$. For such an n-type transistor 802, both the source 804 and drain 806 comprise n-doped regions in a p-doped substrate. The transistor operates so that when at least a threshold voltage is applied to the gate 810, current flows between the source 804 and drain 806 through an intermediate channel region. In circuits, the enhancement-mode transistor 802 is denoted with symbol 820.

Figure 8B:
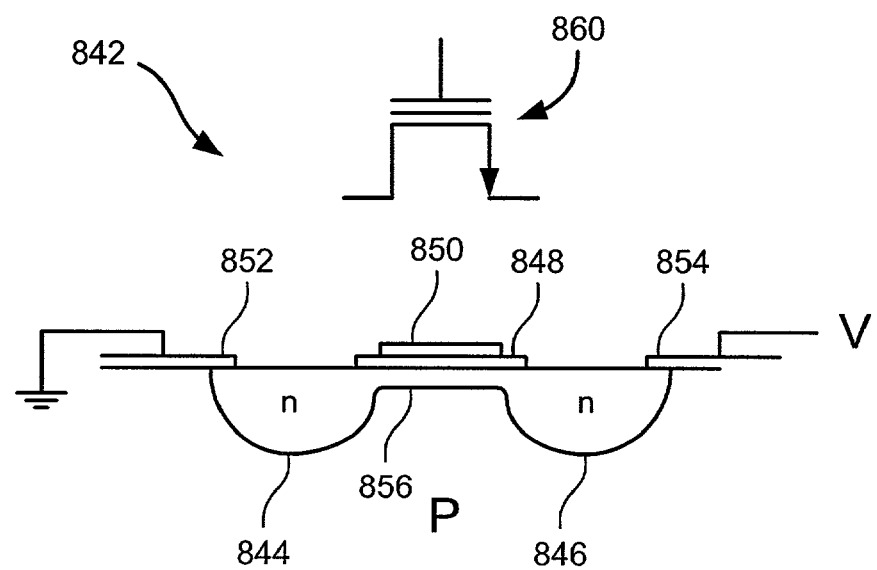
FIG. 8B provides a schematic illustration of a depletion-mode transistor.

The depletion-mode transistor 842 illustrated in FIG. 8B also comprises a source 844, a drain 846, and a gate 850 formed over an oxide 848, with connections to the source 844 and drain 846 provided respectively by pads 852 and 854. For the depletion-mode transistor, however, the channel region 856 between the source 844 and drain 846 is also n-doped, allowing the flow of current even without a gate voltage. The current can be stopped by applying at least a negative cutoff voltage to the gate 850. In circuits, the depletion-mode transistor 842 is denoted with symbol 860.

Figure 8C:
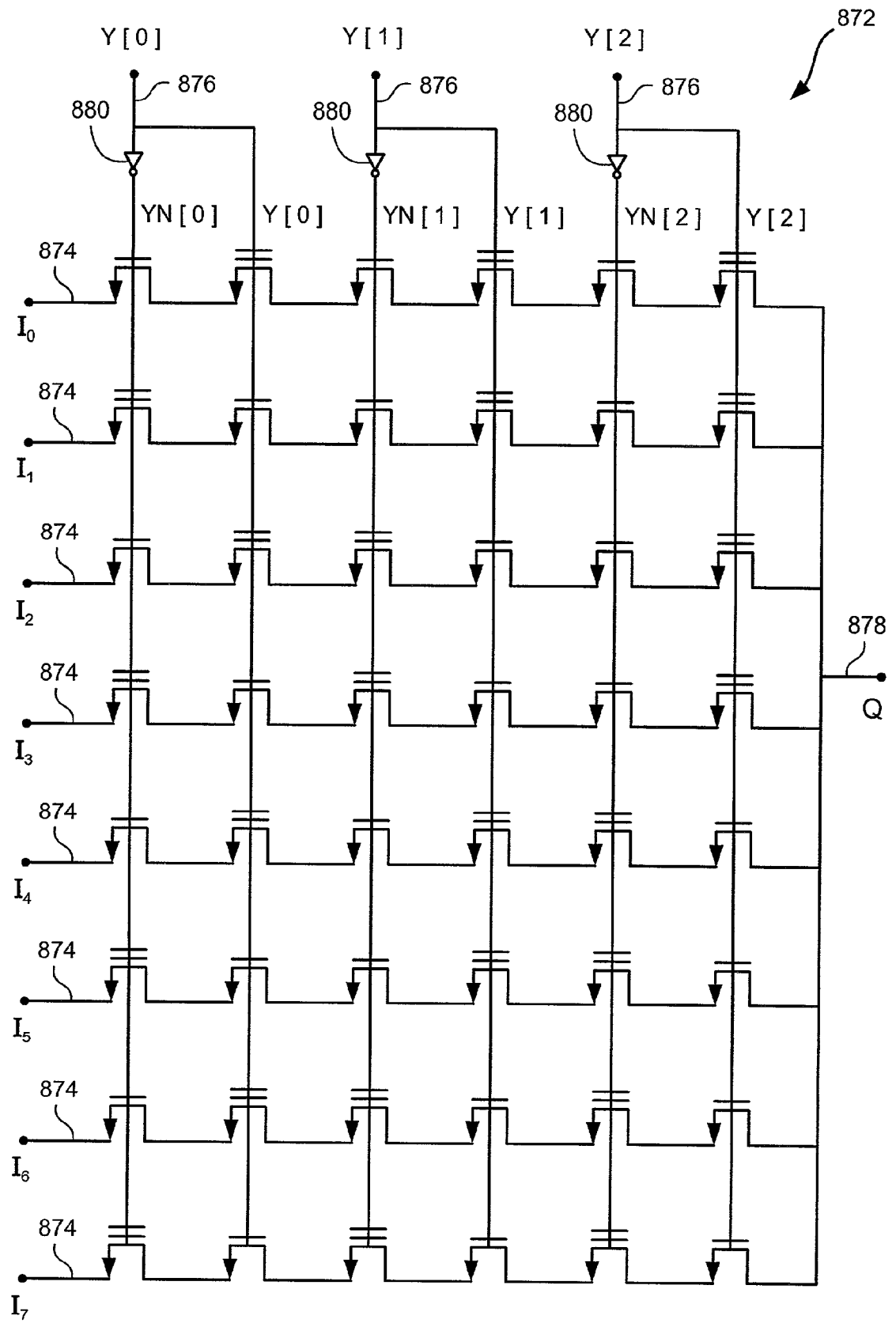
FIG. 8C provides a circuit layout for a universal logic gate according to an embodiment of the invention that uses depletion-mode transistors.

FIG. 8C provides an example of a circuit for a ULG element that exploits the different properties of enhancement- and depletion-mode transistors to allow a smaller circuit area than a ULG design that uses only enhancement-mode transistors. The illustration is provided for the U8 cell, which acts as an 8:1 multiplexor. The U8 cell 872 comprises eight inputs 874 labeled $I_{0 \ldots 8}$, three selection controls 876 labeled Y[0 . . . 2], and one output 878 labeled Q. The multiplexing functions of the cell are governed by the action of 48 transistors, of which half are provided as depletion-mode transistors. Each of the controls 876 and its inversion is provided to a transistor along the path of one of the inputs 874, with the inversions being effected by inverters 880. To effect the multiplexing functions, the depletion-mode transistors are distributed according to the level of the control. For the least significant control, the depletion-mode transistors are positioned alternately; for the next significant control, they are positioned alternately in pairs; for the next significant control, they are positioned alternately in quads; etc. Thus, for the U8 cell 872, depletion-mode transistors for Y[0] are provided for inputs $I_0$, $I_2$, $I_4$, and $I_6$, and for the inverted control YN[0], depletion-mode transistors are provided for inputs $I_1$, $I_3$, $I_5$, and $_7$. For Y[1], depletion-mode transistors are provided for inputs $I_0$, $I_1$, $I_4$, and $I_5$, and for the inverted control YN[1], they are provided for inputs $I_2$, $I_3$, $I_6$, and $I_7$. Similarly, depletion-mode transistors are provided for Y[2] for inputs $I_0$, $I_1$, $I_2$, and $_3$, and for YN[2] for inputs $I_4$, $I_5$, $I_6$, and $I_7$.

For certain embodiments of the ULGs that comprise depletion-mode transistors, this pattern may be used for a cell of any size. For a $U2^{n+1}$ ULG that has $2^{n+1}$ inputs and n+1 controls, depletion-mode transistors may be provided for each control/input combination as follows:

(i) For control Y[i=0 . . . n], depletion-mode transistors are provided for inputs $I_k$ where $k < 2^i \bmod 2^{i+1}$;

(ii) For control YN[i=0 . . . n], depletion-mode transistors are provided for inputs $I_{k'}$, where $k' \geq 2^i \bmod 2^{i+1}$.

In other embodiments, a different distribution of depletion-mode transistors may be used to implement the multiplexing functions of the ULG.

III. Logical Structures

In addition to the structural characteristics described above, there are a number logical properties and features that may be used both to characterize individual cells and to characterize libraries of such cells. An example of a formalism that may be used in one embodiment to describe the functionality of the basic cells and from which at least some such logical characterizations may be extracted is now described.

As discussed above, the selection circuits embodied by ULGs used for forming basic cells may be implemented using 2:1, 4:1, 8:1, or perhaps even larger, multiplexors. The inputs and control of each multiplexor are programmed to achieve the desired logical characteristics of the cell. The following syntax has been developed to describe the programming of such inputs and selection controls in a general fashion:

$$Q<QN>.xxxx \quad <E>Y[n-1:0]I_{2^n-1}I_{2^n-2} \ldots I_0<R/S><CLK>(\text{Parameter}=\text{Option});$$

In addition to describing the programming of the ULG kernel cells, the syntax may be used to describe any of the basic cells, including both those that comprise ULG kernel cells and those that do not comprise ULG kernel cells. Optional parameters in the syntax are denoted with angular brackets and the components of the syntax are summarized in Table I.

TABLE VIII

| Component | Meaning |
| --- | --- |
| Q | Non-inverting output |
| <QN> | Optional inverting output |
| .xxxx | Cell name |
| <E> | Optional tri-state enable |
| Y[n – 1:0] | Control variables |
|  | State variables |
| $I_x$ | Truth-table state |
|  | Next state |
| <R/S> | Optional reset or set input |
| <CLK> | Optional clock input |
| (Parameter = Option) | Selects an option |
| ; | Terminator |

There are a number of features of the syntax worthy of comment. The first component of the syntax indicates the output of the cell, using either Q or QN respectively to denote the output Q or $\overline{Q}$. This is followed by the name of the cell, which is generally constructed by concatenating the names of the kernel cells comprised by the cell. The names of the kernel cells have been set forth above in Table VIII. Thus, for example, a basic cell that comprises a D F/F and a non-inverting buffer would be named .DB (D→B); a basic cell that comprises a resetable D F/F and an inverting buffer would be named .DRBN (DR→BN); a basic cell that comprises a ULG multiplexor and a setable D F/F would be named .UDS (U→DS); and a basic cell that comprises a ULG multiplexor, a D F/F, and a tristatable buffer would be named .UDZB (U→D→ZB). It is noted that some of these examples of basic cells include a ULG multiplexor kernel cell while others do not, but all of these may be described with the syntax.

In those instances where the syntax is used to describe a basic cell comprising a ULG, the number of selection control inputs provided to the ULG is n. In a specific embodiment, the control inputs are ordered by significance, with the most significant control on the left and the least significant control on the right. While the syntax is equally robust for describing basic cells for any value of n, for purposes of explanation the examples provided herein generally correspond to cases in which $n \leq 3$. The states of the n control inputs Y dictate which of $2^n$ inputs are passed to the output of the ULG. While in some instances, the control inputs may be identified individually, in other instances a range of control inputs is identified by using a colon in the argument of Y. Specifically, "Y[a:b]" is intended to refer to the full expression "Y[a]Y[a−19 Y[a−2] . . . Y[b+2]Y[b+1] Y[b]." The set of parameters $I_{2^n-1} I_{2^n-2} \ldots I_0$ represents the logical function to be applied by the cell, and as discussed in greater detail below may comprise a truth table for implementing a combinational logic device or may comprise an identification of the next state of a sequential circuit. In some embodiments, these logical states $I_{2^n-1} I_{2^n-2} \ldots I_0$ may be assigned to logical 1's or 0's (sometimes referred to herein as "base Boolean values"), but may more generally include map-entered variables as well. For the basic cell, this corresponds to a connection to VDD for a logic 1, to a connection to VSS for a logic 0, and to a connection to a signal for a mapped entered variable. Parameters such as the type of reset, i.e. asynchronous, synchronous, or clock-edge, are assigned and enclosed in parentheses at the end of the statement.

This formalism permits the expression of a number of manipulations that are possible with embodiments of the invention and which are discussed in detail in order to enable one of skill in the art to perform such manipulations. The nature of such manipulations may be clarified with a simple example for the combinational logic function C=A+B. This logic function may be expressed in a concise hardware description language ("CHDL") formalism as follows:

```
C .UB    A    B    VDD VDD VSS VDD ;
```

That this is a correct implementation of the logic function in which C is equal to "A or not B" is evident by comparing the entries in the expression to the syntax discussed above. The name of the cell .UB indicates that the function is implemented with a cell that comprises a universal logic gate U and a non-inverting buffer B. On either side of the name, the parameters involved in the function are denoted, with the left-most component of the expression C indicating the output, and the variables to the right of the name A and B indicating the inputs. The following four entries before the terminator define the following truth table $I_{2^n-1} I_{2^n-2} \ldots I_0$ for the combinational function, with VDD being equivalent to a logic 1 and VSS being equivalent to a logic 0. The individual truth-table states I are noted:

TABLE IX

|       | C | A | B |
|-------|---|---|---|
| $I_3 =$ | 1 | 0 | 0 |
| $I_2 =$ | 1 | 0 | 1 |
| $I_1 =$ | 0 | 1 | 0 |
| $I_0 =$ | 1 | 1 | 1 |

When logical operations are performed on expressions in this formalism, they indicate directly how the resulting expression may be implemented with basic blocks in accordance with an embodiment of the invention. For example, a simple logical operation is inversion of the output, which may be implemented by using an inverting buffer:

```
CN .UBN   A    B    VDD VDD VSS VDD ;
```

As can be seen, the same truth table as that defined in Table IX is used for implementing $\overline{C}$, but the implementation is with a basic cell comprising a universal logic gate U and an inverting buffer BN. An alternative implementation of $\overline{C}$ uses the same .UB basic cell, but instead uses a different truth table by inverting all of the input states:

```
CN .UB    A    B    VSS VSS VDD VSS ;
```

In other instances, alternative implementations of the same logical function may be achieved by performing operations on the control inputs. For example, the control inputs A and B may be permuted. Permuting the control for the function acts to rearrange the truth table. In an embodiment that includes this example, the truth-table states $I_3$ and $I_0$ remain in the same position because they represent states where both controls are high or both are low. States I2 and I1, which represent states where one control is high and the other is low, are interchanged:

```
C .UB    B    A    VDD VSS VDD VDD ;
```

A permutation of the truth table may also result from inversion of one or more of the control inputs. In this example, inverting the least significant control B interchanges neighboring states in the truth table:

```
C .UB    A    BN   VDD VDD VDD VSS ;
```

This alternative expression for may be viewed as defining an implementation for C that uses the general truth table for $X+\overline{Y}$, but with control inputs defined so that X=A and $Y=\overline{B}$. If the next significant control A is inverted in the original expression instead, neighboring pairs of states in the truth table are interchanged:

```
C .UB    AN   B    VSS VDD VDD VDD ;
```

It is evident that this expression implements the general truth table for $\overline{X}+\overline{Y}$, but with control inputs defined so that X=A and Y=B. If both control inputs are inverted,

```
C .UB  AN  BN  VDD VSS VDD VDD ;
```

The truth table in this expression implements the general function $\underline{X}+\underline{Y}$, but with control inputs defined so that X=A and Y=B.

The CHDL syntax also permits control variables to be entered as elements in the truth-table states. For example, the syntax makes it easy to recognize that the result C is high whenever A is high and that C takes the value of BN when A is low. This may be expressed in this CHDL syntax as

```
C .UB  A  VDD BN ;
``` and corresponding to the truth table shown in Table X:

TABLE X

|  | C | A |
|---|---|---|
| $I_1 =$ | 1 | 0 |
| $I_0 =$ | $\bar{B}$ | 1 |

Equally, the syntax makes it easy to recognize that the result C is high whenever B is low and that C takes the value of A when B is low. This may be expressed in this CHDL syntax as

```
C .UB  B  A VDD ;
``` and corresponding to the truth table shown in Table XI:

TABLE XI

|  | C | B |
|---|---|---|
| $I_1 =$ | A | 0 |
| $I_0 =$ | 1 | 1 |

Not only does the CHDL syntax presented here easily admit control variables to be presented as map-entered variables, but this same ability is manifested in the implementations with the cells described above. In particular, either of the two above examples may be as easily implemented using a combination of a ULG and buffer (".UB") as is any truth table that uses the basic Boolean variables 0 and 1 exclusively. Implementation of all of these logical functions is simply a matter of assigning the truth-table states and control variables in accordance with the universal logic elements as described above.

The formalism thus makes clear that embodiments of the invention permit the implementation of a diverse range of logical functions. Specific examples of some of these properties are now discussed in greater detail. In discussing logical properties that may be exploited in certain embodiments of the invention, reference is sometimes made to the formalism explained above. Such reference is made primarily for reasons of convenience and is not in any way intended to limit the scope of the invention. In particular, it will be evident to those of skill in the art that it is possible to implement each legitimate syntactical expression in the formalism with the cells discussed above. Accordingly, the logical properties of the formalism correspond directly to logical functions that may be implemented with the cell arrangements in different embodiments.

One property of the formalism, and therefore also of the cell arrangements, is that no high-level distinction is made between combinational and sequential circuits; both such circuits are merely special cases of the more general types of logical functions that may be implemented. A combinational circuit is one in which the output(s) are predetermined functions of the input(s). As such, the logic implemented by a combinational circuit can be represented by a truth table setting forth a mapping between all possible Boolean states of the input(s) to the Boolean states of the output(s). This may be contrasted with a sequential circuit in which the logical application of the circuit relies on a history of past inputs. The application of such logic may instead be represented with a next-state equation that maps the past input(s) to the output(s). Embodiments of the invention described herein are not restricted either to combinational or sequential logic. For example, only slight differences in cells are needed to implement the following syntactic CHDL expressions:

```
Q .UB  A B  VDD VDD C VSS ;

Q .UD  A B  VDD VDD C VSS CLK ;
```

The first of these expressions represents a combinational logic function and the second represents a sequential logic function. In other embodiments, the formalism and corresponding cell implementations may include both combinational and sequential aspects so that a characterization of the function is not properly limited to either category. This additional flexibility permits certain optimizations, some of which are discussed below, that are not available when limited to either combinational or sequential logic.

This additional flexibility also arises in part from the more general character of cells made in accordance with embodiments of the invention to implement selection logic, in addition to combinational and selection logic. As used herein, a "selection operation" refers to a function in which one or more of a plurality of inputs are passed as outputs. In certain embodiments, the selection operation passes one of a plurality of inputs as an output. Such a selection operation differs from a sequential-logic operation because it does not depend on a past history of the inputs. It also differs from combinational-logic operations, which do not require that the output correspond to one of the inputs. This is easily seen for an NAND gate, which produces an output 1 in response to two 0 inputs; the output does not correspond to either of the inputs. It is also true, however, for an OR gate. Although in every instance the output of an OR gate is equal to one of the inputs, the gate does not act to pass one of the inputs as an output; instead, a combinational mapping is performed from the inputs to the outputs that happens to include some commonality. In addition, selection operations are not limited to instances in which the number of inputs is two and/or the number of outputs is one. More generally, any plurality $P_{in}\,(\geqq 2)$ of inputs may be accepted, of which a number $P_{out}\,(\geqq 1)$ are passed.

Embodiments of the invention also do not limit the inputs and/or outputs to the base Boolean values 0 and 1. As noted in connection with Tables X and XI and the associated syntactic expressions, cells used in embodiments of the invention may implement operations in which truth-table entries are instead functions of such base Boolean values. In this respect, the invention includes embodiments that provide for the implementation of Boolean functionals, which are defined herein as operations that admit functions of Boolean variables among their inputs and/or outputs, in addition to admitting base Boolean values among their inputs and/or outputs.

Both the formalism presented herein and the implementation with the cells described above permit a further generalization that increases the flexibility of digital design and its optimization. Such a generalization may be understood with reference to what are defined herein as higher-order Boolean functions. Conventional digital circuit design uses only what are referred to herein as zero-order Boolean functions, which admit only base Boolean values among their input(s) and/or output. In contrast, some embodiments of the invention use a first-order Boolean function, which corresponds to a Boolean functional and admits zero-order Boolean functions in addition to base Boolean values among its inputs and/or output(s). Other embodiments use a second-order Boolean function, which admits first-order Boolean functions, zero-order Boolean functions, and base Boolean values among its inputs ard/or output(s). In still other embodiments of the invention, even greater orders of Boolean functions are used, such orders admitting all lower orders of Boolean functions among their inputs and/or output(s) in addition to admitting the base Boolean values used in conventional design. All orders of Boolean functions other than zero-order Boolean functions are sometimes referred to herein collectively as "higher-order" Boolean functions.

This generalization may be illustrated with an example based on the C=A+B example discussed earlier:

```
J .UB   G H VDD VSS F C

F .UB   D E VSS C VDD C

C .UB   A B VDD VDD VSS VDD
```

In this example, the third expression corresponds to the zero-order function C=A+B, which admits only base Boolean vales 0 and 1 among its arguments. Such a function uses a combinational mapping and may be implemented using gates, such as with an OR gate and a NOT gate. The second expression corresponds to a first-order function, or functional, that admits the zero-order function C as one of its arguments, in addition to admitting the base Boolean values. The first expression corresponds to a second-order function that admits the first-order function F, the zero-order function C, and the base Boolean values among its arguments. The first and second expressions thus each correspond to expressions for higher-order functions. All three of the expressions may be implemented in embodiments of the invention using the cells as described above.

One effect of the ability to use higher-order functions may be seen with a comparison to the exclusive use of Boolean operations. Such Boolean operators operate only on the base Boolean values 0 or 1, or on variables that represent the base Boolean values 0 or 1, i.e. that have already had a value of 0 or 1 bound to it. Boolean minimization or optimization techniques are based on decomposing the expressions being minimized to consider the meaningful possible combinations of assignment of 0 or 1 to each Boolean variable (with the possible existence of "don't care" states for some variables under some circumstances reducing the meaningful possible combinations downward from the set of all possible combinations). Higher-order functions allow one to optimize, or minimize a circuit, without the requirement to decompose the function result to each possible value and considering each separately. In other words, when a circuit with the algorithms described below, one need not know what the value of the functions or variables are; optimization is performed regardless. In conventional methods limited to the use of Boolean operators, each variable and function is decomposed into all possible values for the functions and variables, i.e. to define a complete truth table, before any optimization can be performed; in such conventional methods one must exhaustively assign a value to all variables and functions.

IV. Optimization

The expanded availability of logical operations provided by embodiments that use cells based on the ULGs and as represented by the formalism described permits increased optimization. In many instances, these logical operations may be used to determine optimized methods of implementing a given function. A number of such logical operations are illustrated, and it will be understood by those of skill in the art that still other logical operations may derive from the formalism in other embodiments of the invention. Moreover, while the formalism is used as a matter of convenience to illustrate the nature of the optimizations, it will be understood that all the expressions that follow may be implemented using the previously described cells in the manner explained. This is true even in instances where the expressions correspond to functions not accessible by standard Boolean logic. In some cases, use of the formalism shows how multiple manipulations may be performed to achieve an optimization, it being necessary only to implement the final result with the previously described cells to achieve the optimized function.

A number of the operations that may be performed with logical functions as expressed using the formalism described herein are summarized in FIGS. 9A–9D, which provide flow diagrams to explain how some such operations may be performed. In different embodiments, various combinations of one or more such operations may be performed and the invention is not limited to any particular order or number of such operations. Accordingly, each of FIGS. 9A–9D indicates that it may be entered as part of a greater flow of operations from a previous transformation. It is not necessary that a previous transformation necessarily have been performed in any case, although the indication is included to note that some embodiments of the invention contemplate that previous transformations may have been performed. Also, while the flow diagrams in each of FIGS. 9A–9D shows an exemplary order in which operations may be performed, such an ordering is not necessary and alternative embodiments permit alternative orderings. Moreover, in some embodiments, it is possible that some operations may be performed simultaneously, such as when different parts of a large structure are optimized at the same time.

Figure 9A:
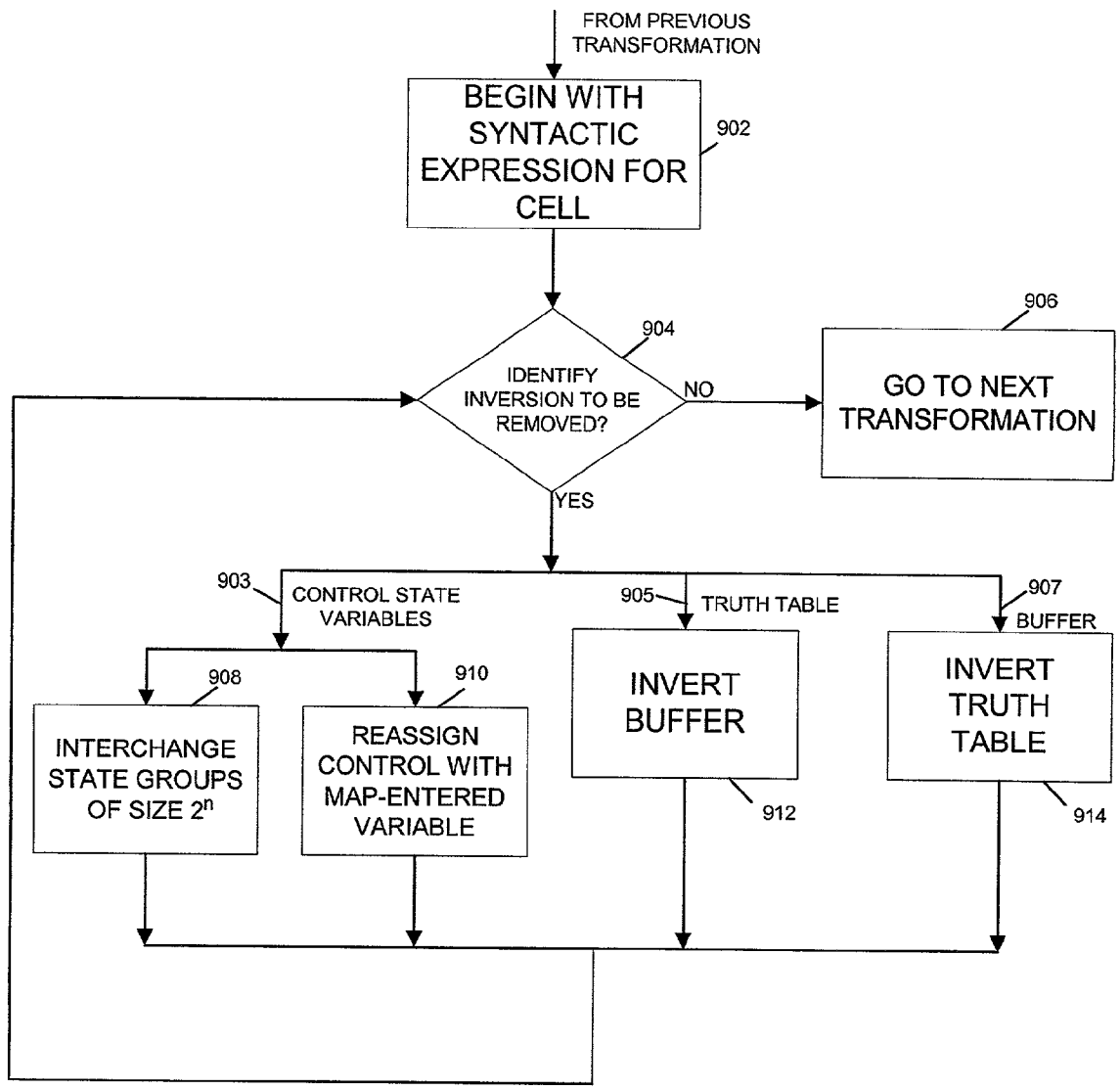
FIG. 9A is a flow diagram illustrating how inversions may be removed in logical expressions implemented in embodiments of the invention.

FIG. 9A summarizes a number of operations that may collectively be considered to correspond to the removal of inversions. Accordingly, the method shown in FIG. 9A begins at block 902 with a syntactic expression for a cell, perhaps, but not necessarily, after certain previous logical transformations have been effected. At block 904, an identification is made whether there are any inversions in the syntactic expression for removal. If not, the method proceeds to a potentially subsequent transformation at block 906. In the event that it is desirable to remove an inversion, the method may proceed along one of at least three branches depending on the type of inversion. Branch 903 corresponds to inversions in the control or state variables Y; branch 905 corresponds to inversions in the truth table; and branch 907 corresponds to inversions in the buffer.

In one embodiment, inversions of the control or state variable may proceed at block 908 by interchanging adjacent groups in the truth table. The size of the groups to be interchanged depends on the significance of the control or state variable to be inverted. Thus, if a control Y[k] is to be inverted, groups of size $2^k$ are inverted. This may be illustrated by considering a cell comprising a ULG and a buffer:

```
Q .UB   Y[2] Y[1] YN[0]   A B C D E F G H ;
```

In this instance, the least significant control Y[0], defined by k=0, is to be inverted so that adjacent states are interchanged:

```
Q .UB   Y[2] Y[1] Y[0]    B A D C F E H G ;
```

In a similar fashion, when k=1 for the control to be inverted, adjacent pairs of states are to be interchanged:

```
Q .UB   Y[2] YN[1] Y[0]   A B C D E F G H ;
Q .UB   Y[2] Y[1]  Y[0]   C D A B G H E F ;
```

When k=2 for the control to be inverted, adjacent quads of states are to be interchanged:

```
Q .UB   YN[2] Y[1] Y[0]   A B C D E F G H ;
Q .UB   Y[2]  Y[1] Y[0]   E F G H A B C D ;
```

The flow diagram in FIG. 9A provides a loop back to block 904 after a particular control has been inverted by interchanging states. This contemplates the possibility of performing inversions on multiple controls, which are therefore effected by performing the relevant interchanges in succession. The interchanges are commutative so that the resulting syntactic expression is independent of the order in which they are performed:

```
Q .UB   YN[2] YN[1] YN[0]   A B C D E F G H ;
Q .UB   Y[2]  Y[1]  Y[0]    H G F E D C B A ;
```

The resulting expression, which may be implemented using the cells as described above, follows from any order of performing the control inversions and respective truth-table interchanges.

The flow diagram of FIG. 9A notes at block 910 that in some instances the removal of inversions may be accomplished by entering the control as a map-entered variable instead of performing interchanges. In such cases, the ability of embodiments of the invention to accommodate non-Boolean selection operations is exploited to achieve greater levels of optimization. Within the syntax used to illustrate the principles described herein, the identification of an inverted control YN with a sequence VSS VDD permits removal of the inversion by entering the control into the truth table:

```
Q .UB   Y[1] YN[0]    VSS VDD A A ;
Q .UB   Y[1]          Y[0] A ;
```

As indicated, entry of the control in the truth table will usually also require a repetition of a state A at the appropriate level.

In some cases, it may be desirable to permute the truth table to achieve such VSS VDD sequences by permuting the control:

```
Q .UB   YN[1] Y[0]    VSS A VDD A ;
Q .UB   Y[0]  YN[1]   VSS VDD A A ;
Q .UB   Y[0]          Y[1] A ;
```

In the above progression, optimization of the cell is achieved by noting that the sequence VSS VDD may be achieved through a permutation of the truth table and by noting the repetition of state A. Permuting the controls results in a truth table identical to that of the preceding example, and therefore the least significant control may become a map-entered variable.

The same principles apply with more significant levels of control, for which optimization may remove an inversion by entering the more significant control as a map-entered variable under some circumstances. In one embodiment, for example, this is achieved when the less significant controls are redundant:

```
Q .UB   Y[2] YN[1] Y[0]   A A A A VSS VSS VDD VDD ;
Q .UB   Y[2]              A Y[1] ;
```

The optimization has been achieved by recognizing the existence of an analogous pattern, namely the repetition of A at a higher significance level and the existence of the sequence VSS VSS VDD VDD. It will now be evident to those of skill in the art that permutation of control may be used to restructure the truth table to identify such sequences and thereby optimize the function by removing the inversion. In addition, it will also be evident that these principles may be applied to any significance level for the control. For example, an eightfold repetition of A coupled with the sequence VSS VSS VSS VSS VDD VDD VDD VDD will permit removal of a YN[2] inversion, perhaps after permuting the controls to achieve such a sequence in the truth table.

At block 912 of FIG. 9A, it is noted that inversion of the truth-table states may be achieved by inverting the buffer in the cell:

```
Q .UBN  Y[0]   AN BN ;
Q .UB   Y[0]   A B ;
```

By inverting the buffer, all entries in the truth table are inverted. Block 914 notes the converse function in which the buffer is inverted by inverting all elements of the truth table. While the functional effect of blocks 912 and 914 is identical, they are conceptually converse because in one instance the goal of inverting the truth table is achieved by inverting the buffer and in the other instance the goal of inverting the buffer is achieved by inverting the truth table.

Every operation in the FIG. 9A cycles back to block 904. As noted with respect to block 908, this aspect emphasizes that multiple of these transformations may be used in effecting optimizations and that they may be performed in different orders. For example, for some cells, optimization might be achieved by: (1) first, inverting a buffer to invert a truth table; (2) second, permuting the control so that the resulting truth table includes sequences that permit the entry of control variables; and (3) finally, performing interchanges within the truth table to remove other control inversions.

Figure 9B:
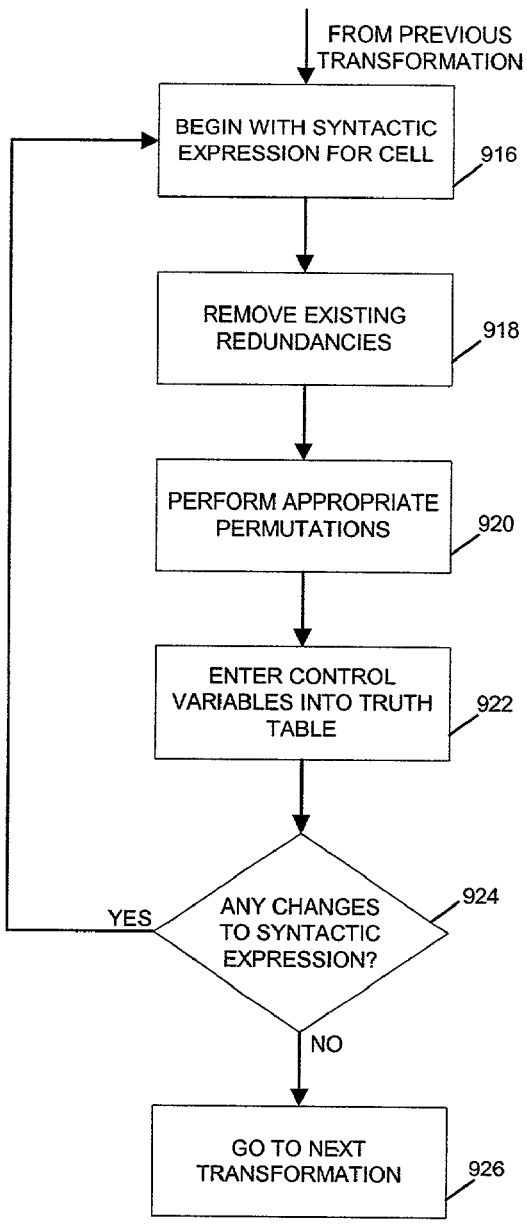
FIG. 9B is a flow diagram illustrating how nodes may be reduced in logical expressions implemented in embodiments of the invention.

The entry of a control variable into a truth table as a map-entered variable, such as discussed with respect to block 910 in FIG. 9A not only has the effect of removing an inversion, but also reduces the number of nodes in the cell. There are other truth-table sequences that permit optimization by accepting the entry of control variables and thereby reducing the number of nodes. The flow diagram in FIG. 9B provides a general explanation of how such sequences may be achieved. Essentially, the same procedures are followed as discussed with respect to block 910 for inversions: a truth-table having elements of certain sequences is identified and permuted to realize those sequences, which are then optimized by entering the corresponding control variable. A simple example corresponds to the example discussed with respect to block 910, but without the inversion:

```
Q .UB  Y[1] Y[0]   VDD VSS A A ;

Q .UB  Y[1]        Y[0] A ;
```

In this example, a repetition of A with the sequence VDD VSS (instead of the sequence VSS VDD) is sufficient to enter the least-significant control variable into the truth table. This is done with the control variable directly, instead of with its inversion as was done in block 910.

Thus, the general procedure illustrated in FIG. 9B begins at block 916 with a syntactic expression for a cell, with the figure noting that it is possible (but not required) in some embodiments for certain other transformations to have been performed previously with the syntactic expression. At block 918, existing redundancies in the control are removed. Such redundancies are manifested by a repetition in the truth table at the level of the redundant control, i.e. in groups of size $2^k$ for control Y[k]. A trivial case occurs for the lowest level of control:

```
Q .UB  Y[0]   A A ;

Q .B          A ;
```

This example is trivial because the cell does nothing other than produce the result A for every input; control is unnecessary and may be removed entirely. The same principle applies, however, for higher levels of control. For example, when k=1, the repetition of pairs of states may permit the removal of Y[1]:

```
Q .UB  Y[1] Y[0]   A B A B ;

Q .UB  Y[0]        A B ;
```

This result simply uses the fact that the higher control level has no effect, with the output of the cell depending solely on the least significant control. Similarly, when k=2, the repetition of quads of states may permit the removal of Y[2]:

```
Q .UB  Y[2] Y[1] Y[0]   A B C D A B C D ;

Q .UB  Y[1] Y[0]        A B C D ;
```

This result expresses the fact that the output of the cell is dependent only on the two lowest control levels and that the highest control has no effect. These principles may be extended to still larger repeated blocks and the consequent removal of still more significant control levels.

At block 920, permutations may be performed in the control to rearrange the truth table to identify sequences that permit the entry of the control variables. For the entry of a lowest level control, sequences of VDD VSS, coupled with a pair of repeated variables A A, is sought. For the entry of the next level control, sequences of VDD VDD VSS VSS, coupled with four repeated variables A A A A, is sought. For the next level control, sequences of VDD VDD VDD VDD VSS VSS VSS VSS, coupled with eight repeated variables A A A A A A A A, is sought. Similar sequences for still higher control levels follow the same pattern. At block 922, the control variable(s) are entered into the truth table to account for these patterns.

Thus, one example of applying blocks 920 and 922 is as follows:

```
Q .UB  Y[2] Y[1] Y[0]   VDD VDD VSS VSS A B A B ;

Q .UB  Y[2] Y[0] Y[1]   VDD VSS VDD VSS A A B B ;

Q .UB  Y[2] Y[0]        Y[1] Y[1] A B ;
```

In the initial syntactic expression, the sequence VDD VDD VSS VSS appears, but it is not possible to remove the k=1 control because there is no corresponding sequence of four repeated variables. The existence of duplicates of both A and B, however, suggests that the controls may be permuted to achieve sequences of VDD VSS coupled with pairs of repeated variables. This is achieved in the second line by permuting Y[1] and Y[0]. Accordingly, it is possible in the third line to enter two occurrences of the Y[1], which is now the lowest level of control, into the truth table. The corresponding cell is therefore optimized by reducing the number of nodes and entering the original Y[1] control variable into the truth table.

Block 924 notes that the process of identifying and removing redundancies and permuting control variables to permit their entry into the truth table may be repeated to achieve further optimizations. The method is thus looped until these procedures have optimized the syntactic expression in this way as much as desired. At block 926, the method thus proceeds to another type of transformation, if desired, to effect further optimizations.

Figure 9C:
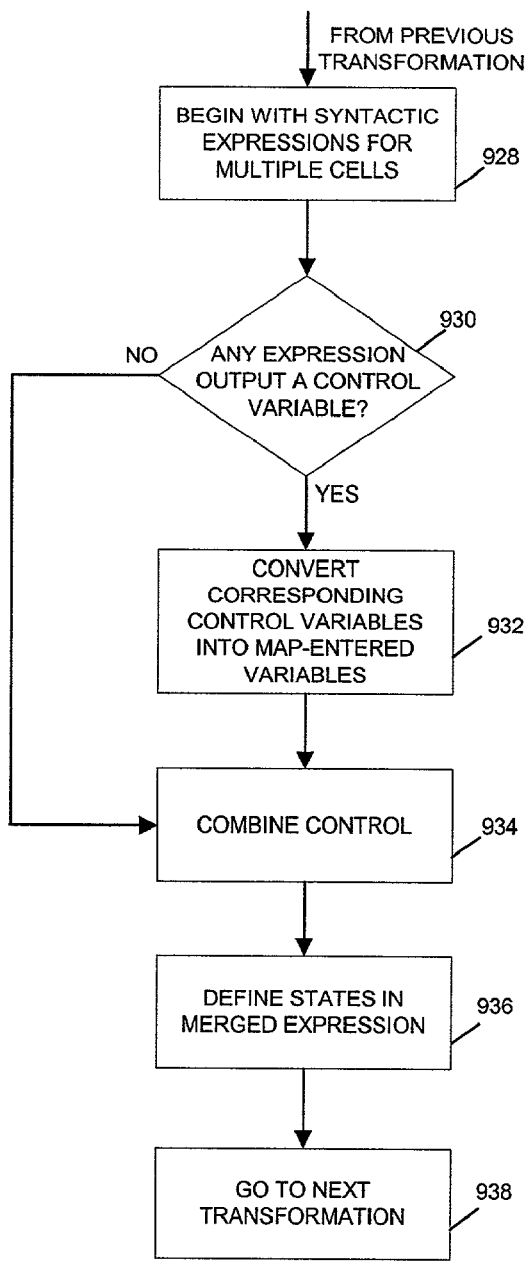
FIG. 9C is a flow diagram illustrating how nodes may be combined in logical expressions implemented in embodiments of the invention.

In addition to reducing nodes for a single cell, it is possible in embodiments of the invention to provide optimizations by combining nodes from multiple cells. The flow diagram shown in FIG. 9C provides a method corresponding to one embodiment for combining nodes. The method begins at block 928 with syntactic expressions for multiple cells. As for the other optimization procedures, FIG. 9C notes explicitly that prior transformations may have taken place on these syntactic expressions, although this is not required. In considering whether nodes can be combined, a check is made at block 930 whether any of the syntactic expressions outputs a control variable present in another of the expressions. If so, the control variables are converted into map-entered variables at block 932. Examples of combining nodes in which such conversions are used are provided below, but the principles of combining nodes are initially illustrated for cases where there is no such conversion.

One method for combining nodes is thus summarized by blocks 934 and 936 in which the control for the multiple syntactic expressions is combined and then states in the merged expression are defined. For example, consider the following two syntactic CHDL expressions in which the output of the second expression, A, is one of the inputs to the first expression:

```
Q .UB  YQ     A B ;
A .UB  YA     C D ;
```

The expressions are merged, and the nodes thereby combined, in the following way. First, the control is combined at block 934 by adding the control for the second expression to the first expression—YQ then functions as a k=1 level control and YA functions as a k=0 level control:

```
Q .UB  YQ YA  A A B B ;
```

As can be seen, increasing the level of the YQ control by a single level to k=1 acts to duplicate each of the truth-table entries. The order in which the controls were combined was determined by the relationship between the inputs and outputs of the expressions. Specifically, since the expression for Q has the output of the expression for A as an input, YQ was made the higher-level control and YA the lower-level control. After combining the controls, the states are defined in the merged expression in accordance with the expressions at block 936:

```
Q .UB  YQ YA  C D B B ;
```

In this instance, the sequence A A is substituted with C D in accordance with the syntactic expression for A. The final expression achieves the optimization by permitting implementation of the resulting expression with a single cell as described above.

While this example showed how two expressions could be merged, it may be applied more generally to any number of expressions. For example, the following three expressions may be merged in a similar fashion with a sequential process:

```
Q .UB  YQ     A B ;
A .UB  YA     C D ;
B .UB  YB     E F ;
```

The second and third expressions both have outputs that correspond to inputs of the first expression. Accordingly, in combining control pursuant to block 934, the control of the first expression is used as the highest level control. First, the first and second expressions are merged by combining their control and defining the states in the merged expression in the same way as for the two-expression example:

```
Q .UB  YQ YA     A A B B ;
Q .UB  YQ YA     C D B B ;
```

Subsequently, the third expression is merged into this combination. First, the additional control causes YQ to become a k=2 level control and YA to become a k=1 level control, with YB remaining as a k=0 level control:

```
Q .UB  YQ YA YB  C C D D B B B B ;
```

As seen in this expression, the additional level of control causes a duplication of each of the truth-table elements. The states in this expression are now defined according to block 936 in terms of the original third expression by substituting pairs of B's with the sequence E F:

```
Q .UB  YQ YA YB  C C D D E F E F ;
```

This result thus corresponds to an expression that combines the original three expressions and may be implemented as a cell in the manner described above.

Both of these examples have begun with expressions that correspond to ULG cells that may be implemented with multiplexors of the same size. There is, however, no limitation on embodiments of the invention that requires that they be the same size. It is possible to perform optimizations for combining nodes that correspond to merging a smaller multiplexor into a larger multiplexor or to merging a larger multiplexor into a smaller multiplexor. This may be seen in the following examples in which each of the initial expressions corresponds to a different-sized multiplexor when such an implementation is used. For example, in the set

```
Q .UB  YQ[1] YQ]0]   A B C D ;
A .UB  YA            E F ;
``` the second expression has an output that is used as an input in the first expression, and corresponds to a smaller-sized multiplexor than does the first expression. The nodes are combined in the same fashion already described. First, control is combined in accordance with block 934:

```
Q .UB  YQ[1] YQ[0] YA  A A B B C C D D ;
```

Subsequently, states are defined in the merged expression, in this instance by substituting pairs of A's with E F:

```
Q .UB  YQ[1] YQ[0] YA  E F B B C C D D ;
```

This final expression may thus be implemented as a cell and achieves optimizations resulting from merging the smaller multiplexor into the larger multiplexor.

It is similarly possible to combine nodes in a fashion that corresponds to merging a larger multiplexor into a smaller multiplexor in embodiments that use multiplexors:

```
Q .UB  YQ              A B ;
A .UB  YA[1] YA[0]     C D E F ;
```

In this example the output of the expression corresponding to the larger multiplexor is an input to the expression corresponding to the smaller multiplexor. The nodes are combined in the same way, by first combining the control of the two expressions in accordance with block 934. Since two levels of control from the second expression are to be combined with the first expression, YQ becomes a k=2 level control:

```
Q .UB   YQ YA[1] YA[0]   A A A A B B B B ;
```

Subsequently, the states are defined in accordance with block 936 by substituting quads of A's with C D E F as dictated by the second original expression:

```
Q .UB   YQ YA[1] YA[0]   C D E F B B B B ;
```

Each of these examples illustrates how to combine nodes in different circumstances where the output of one of the expressions is one of the inputs to another of the expressions. In some cases, however, the output of one of the expressions may be one of the controls of another expression, a condition checked for a block 930. In such instances, the control variable is converted into a map-entered variable at block 932 before combining control and defining states. This may be illustrated with the following two examples, the first of which corresponds to an AND sub-function and the second of which corresponds to an OR sub-function.

Thus, consider merging nodes for the following two syntactic expressions:

```
Q .UB      YQ[1] YQ[0]   A VDD VSS VSS ;

YQ[1].UB  YA             B C ;
```

The circumstance in this example differs from the previous examples because the output of the second expression, YQ[1], is a control of the first expression and not an input in the truth table entries. The ability of embodiments to accept variables in the truth-table elements is thus exploited to re-express the first expression with YQ[1] in the truth table. First, the control variables are permuted so that YQ[1] is the least significant control:

```
Q .UB      YQ[0] YQ[1]   A VSS VDD VSS ;
```

Then, it is recognized that with YQ[1] as the least significant control, the VDD VSS sequence in the $I_1$–$I_0$ positions simply corresponds to YQ[1]. It is also recognized that in the $I_3$ position, YQ[1] and A are equivalent. Accordingly, after converting control variables to map-entered variables pursuant to block 932, the expression may be written

```
Q .UB      YQg[0] A      YQ[1] VSS YQ[1] YQ[1] ;
```

Essentially, this conversion recognizes the equivalence of truth tables XIIA and XIIB:

| Table XIIA | | | | Table XIIB | | |
|---|---|---|---|---|---|---|
| Q | YQ[0] | YQ[1] | | Q | YQ[0] | A |
| 0 | 0 | 0 | | YQ[1] | 0 | 0 |
| 1 | 0 | 1 | | YQ[1] | 0 | 1 |
| 0 | 1 | 0 | | 0 | 1 | 0 |
| A | 1 | 1 | | YQ[1] | 1 | 1 |

Combining control with the second expression at block 934 results in

```
Q .UB      YQ[0] A YA    YQ[1] YQ[1] VSS VSS YQ[1]
YQ[1] YQ[1] YQ[1] ;
```

Finally, defining states at block 936 so that pairs of YQ[1] are substituted with B C as required by the original second expression results in the merged expression

```
Q .UB      YQ[0] A YA  B C VSS VSS B C B C ;
```

The same procedure may also be used for the following two syntactic expressions:

```
Q .UB      YQ[1] YQ[0]   VDD VDD A VSS ;

YQ[1] .UB  YA            B C;
```

In this example, the expression for YQ[1] is the same as in the previous example, but the expression for Q is different. Permuting the control variables so that YQ[1] is least significant,

```
Q .UB      YQ[0] YQ[1]   VDD A VDD VSS ;
```

Recognizing that the VDD VSS sequence in the $I_1$–$I_0$ positions corresponds to YQ[1] and that YQ[1] and A in the $I_2$ position are equivalent results in

```
Q .UB      YQ[0] A       VDD YQ[1] YQ[1] YQ[1] ;
```

This conversion effectively recognizes the equivalence of truth tables XIIIA and XIIIB:

| Table XIIA | | | | Table XIIB | | |
|---|---|---|---|---|---|---|
| Q | YQ[0] | YQ[1] | | Q | YQ[0] | A |
| 0 | 0 | 0 | | 1 | 0 | 0 |
| 1 | 0 | 1 | | YQ[1] | 0 | 1 |
| A | 1 | 0 | | YQ[1] | 1 | 0 |
| 1 | 1 | 1 | | YQ[1] | 1 | 1 |

Combining control with the second expression according to block 934 results in

```
Q .UB    YQ[0] A YA    VDD VDD YQ[1] YQ[1] YQ[1] YQ[1]YQ[1] YQ[1] ;
```

Finally, defining states at block 938 so that pairs of YQ[1] are substituted with B C as required by the original second expression results in the merged expression

```
Q .UD    YQ[0] A YA    VDD VDD B C B C B C ;
```

It is noted that in certain instances, the method outlined in FIG. 9C may be combined with moving flip flops forward to facilitate reductions. For example, consider application of the method to the following set of expressions

```
Q .UB   Y[2:1]   A B C D ;
A .UD   Y[0]     E F CLK ;
B .UD   Y[0]     G H CLK ;
C .UD   Y[0]     I J CLK ;
D .UD   Y[0]     K L CLK ;
```

As previously mentioned, the notation Y[2:1] is equivalent to the expression Y[2] Y[1]. This set of expressions could be implemented using five cells, one that comprises a ULG and a buffer and four that comprise a ULG and a F/F. The result of moving the flip flops forward is

```
Q .UD   Y[2:1]   A B C D CLK ;
A .UB   Y[0]     E F ;
B .UB   Y[0]     G H ;
C .UB   Y[0]     I J ;
D .UB   Y[0]     K L ;
```

Accordingly, applying the method of FIG. 9C to combine the nodes results in

```
Q :UD  Y[2:0]   E F G H I J K L CLK ;
```

This expression may be implemented with a cell comprising a ULG and a D F/F in certain embodiments of the invention.

Thus, the method outlined in FIG. 9C permits nodes to be reduced from multiple syntactic expressions. This includes a variety of different circumstances, including cases where there are arbitrarily many syntactic expressions, where some of the expressions correspond to implementations of different sizes, and cases where some of the expressions have outputs that correspond to either inputs or controls of other expressions. After nodes have been merged, the method may proceed to another transformation at block 938, although this is not a requirement.

Additional optimization functions may be realized by using the set and reset facilities that are provided in the formalism and which may be implemented by using those facilities in cells according to embodiments of the invention. The use of set and reset facilities are summarized in FIG. 9D and arise primarily when half the truth table states are either high or low. Thus, a method for optimizing begins with a syntactic expression for a cell at block 940, with FIG. 9D noting explicitly that previous transformations may also have been performed on the cell expression, although this is not a requirement. A check is made at block 944 whether half the truth table states are low. If so, the control variable may be changed to a reset to a F/F in accordance with block 946. For example, consider the syntactic function

```
Q .UD   Y[2:0]   VSS VSS VSS VSS A B C D CLK ;
```

In this example, a cell that implements this function comprises a ULG and a D F/F. As previously mentioned, the notation Y[2:0] is equivalent to Y[2] Y[1] Y [0]. Half of the truth table states in this expression are low, i.e. VSS, so that the highest level control may be entered into the map as a reset input to the F/F:

```
Q .UDR  Y[1:0]   A B C D Y[2] CLK (RST ='C') ;
```

The name of the cell explicitly notes that a resetable D F/F (DR) is used and the reset has been noted. This function may then be implemented using the cells described above.

Figure 9D:
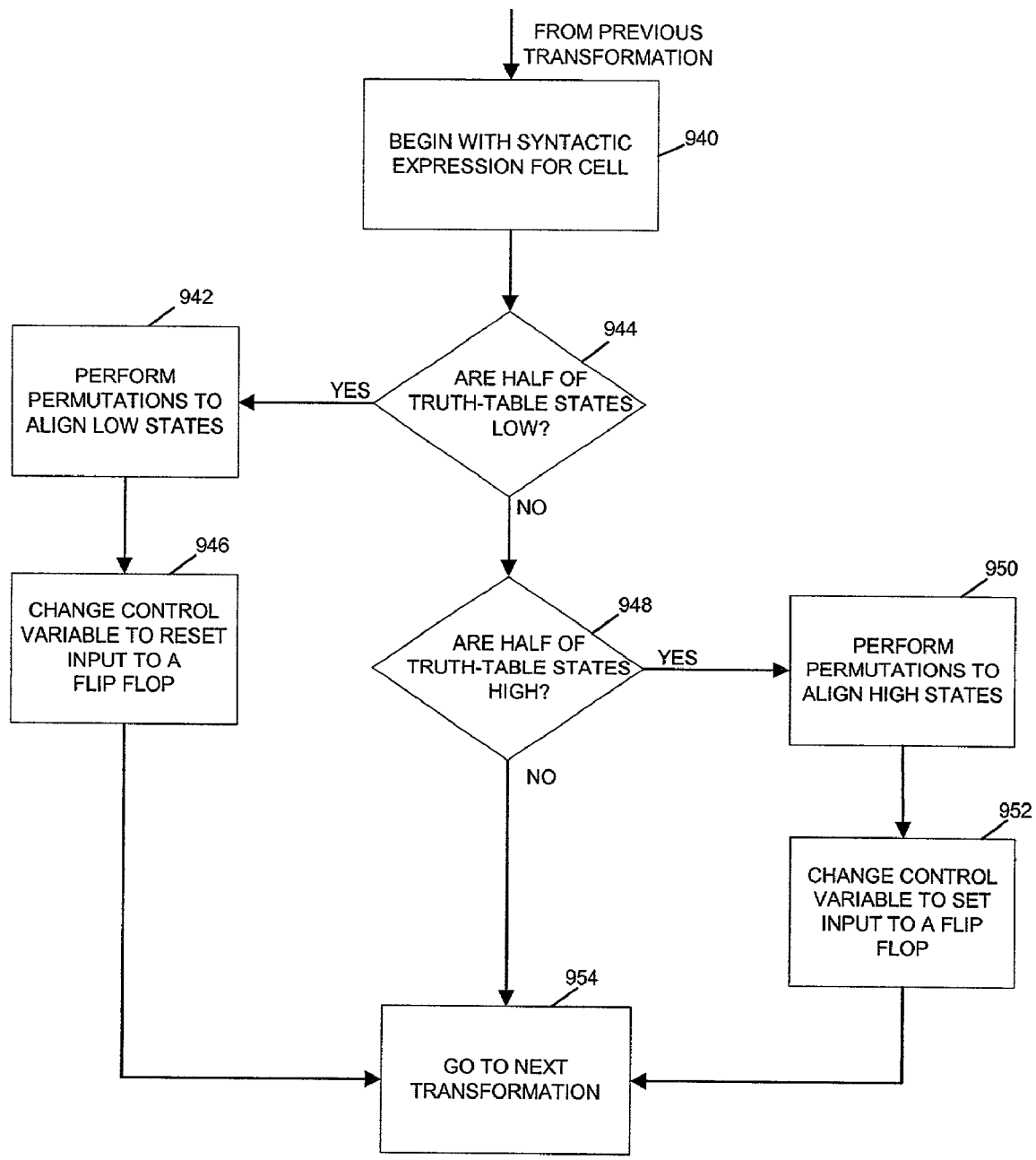
FIG. 9D is a flow diagram illustrating how set and reset inputs may be used in performing optimizations according to embodiments of the invention.

FIG. 9D notes at block 942 that in some instances it may be useful to perform permutations of the control variables to put the truth table into a form that allows using the reset input for optimization. If half the truth table states are low, but do not appear as a group, they may be aligned with the permutations. For example, the function

```
Q .UD    Y[1] Y[0]   VSS A VSS B CLK ;
``` has half of its truth table states low, but they are not aligned. Interchanging the control variables aligns them

```
Q .UD    Y[0] Y[1]   VSS VSS A B CLK ;
``` so that the most significant control variable may be entered into the map at block 946 as a reset input to the F/F:

```
Q .UDR   Y[1]        A B Y[0] CLK (RST = 'C') ;
```

Note that in this example, the lack of alignment among the low states has resulted in Y[0] being entered into the map as part of the optimization rather than Y[1].

Similar optimizations may be achieved if half the truth table states are high, as checked at block 948. If so, permutations of the control variables may be performed at block 950 to align the high states and the control variable entered into the map as a set input to a F/F at block 952. For example, consider the function

```
Q .UD   Y[1:0]       VDD A VDD B CLK ;
```

Half of the states in the truth table are high, i.e. VDD, so that optimization with a set input may be achieved. Permuting the control variables to align the high states in accordance with block 950 results in

```
Q .UD  Y[0] Y[1]    VDD VDD A B CLK ;
```

Entering the most significant control as a map-entered variable as a set input to the F/F results in

```
Q .UDS  Y[1]       A B Y[0] CLK (SET = 'C') ;
```

This function may then be implemented using the cells described above in an embodiment.

Still other combinations of expansion, inversion, and/or permutation may be used to achieve the conditions for using set or reset for optimization. An example that illustrates several of the optimization manipulations discussed above begins with the syntactic expression

```
Q .UD  AN      VSS NOT_RESET CLK ;
```

Optimization of this function may proceed by first expanding the NOT_RESET as a control variable:

```
Q.UD AN NOT_RESET VSS VSS VDD VSS CLK;
```

Inversion of the two control variables in accordance with FIG. 9A results in two interchanges of the truth table, a first interchange based on single entries and a second interchange based on pairs:

```
Q.UD A RESET VSS VDD VSS VSS CLK;
```

Interchanging the controls to prepare for entering A as a map-entered variable results in

```
Q.UD RESET A VSS VSS VDD VSS CLK;
```

The presence of the VDD VSS sequence and the repeated VSS element permits the A control variable to be entered into the map in accordance with FIG. 9B:

```
Q.UD RESET VSS A CLK;
```

It is now apparent that since there are only two states in the truth table and one of them is low, that half the states are low and the control variable may be entered into the map as a reset input to the F/F:

```
Q.DR A RESET CLK (RST = 'C');
```

Since all of the control variables have been entered into the map, there is no need for a ULG element in implementing this optimized expression. Instead, it may be implemented in one embodiment using only a resetable D F/F, even though the original expression corresponded to an implementation comprising both a ULG and a D F/F.

Each syntactical expression of the formalism may be viewed as an entry for a ULG netlist that defines a digital circuit. The ULG netlist uses basic cells and follows the CHDL syntax. Such a ULG netlist may be at least partially optimized by successively performing some of the individual manipulations described above. In some embodiments, the resulting optimized ULG netlist may be implemented directly using the cells described above. In other embodiments, however, the manipulation of the ULG netlist may be viewed as intermediate step in optimizing a digital design that has been expressed in another netlist format. In such instances, the other netlist format using another cell library and/or another syntax (e.g., VHDL or Verilog) is initially translated to the ULG netlist format. After performing some optimization steps, the optimized ULG netlist may be translated back into the original format for implementation. In this way, an embodiment is provided that achieves optimization of digital designs within preexisting netlist formats.

There are a variety of ways in which the individual manipulations of the syntactic expressions comprised by a ULG netlist may be performed and the degree to which the corresponding digital design is optimized may depend on how those manipulations are executed. While in some instances it is possible for the manipulations to be performed by hand by a digital designer, it is expected that at least some level of automation may be used. In one embodiment, for example, a computer program may be provided that allows a digital designer to select the types of manipulations to be performed and sections of the ULG netlist on which to perform them, with the execution of the manipulations being performed automatically. In another embodiment, a predetermined algorithm is used in a completely automated way to perform the manipulations or optimizations.

Figure 10:
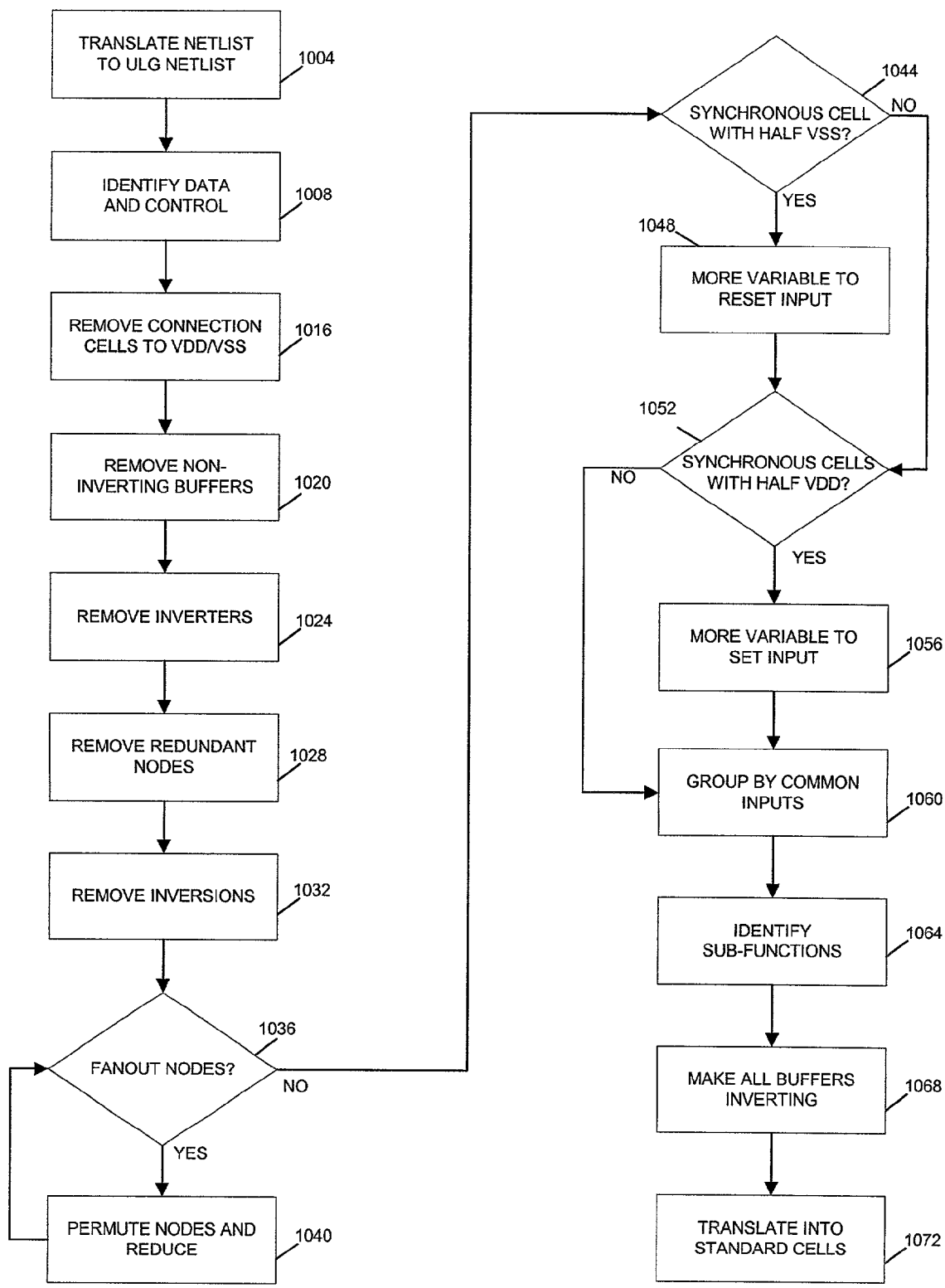
FIG. 10 is a flow diagram illustrating an embodiment for a ULG netlist optimization.

One example of such a predetermined algorithm is illustrated with the flow diagram provided in FIG. 10, although it will be appreciated by those of skill in the art that numerous other algorithms may alternatively be used. In some specific instances, alternative algorithms use the same manipulations but perform them in a different order. In some other specific instances, alternative algorithms use a different set of manipulations. The algorithm shown in FIG. 10 may begin at block 1004 by translating an existing netlist to a ULG netlist if the design to be optimized was not initially created using the ULG formalism. In one embodiment, translating from the existing netlist to the ULG netlist is performed as a one-to-one translation between syntactic expressions. For one embodiment, this translation may be viewed conceptually in terms of the elements used in that embodiment to implement the original and ULG netlists—every logic gate, such as NAND, OR, etc. is converted into a multiplexor-based implementation amenable to optimizations provided by the syntactic manipulations discussed above.

At block 1008, data and control elements are discerned in the resulting ULG netlist. The distinction between such data and selection control elements was previously discussed with respect to Table VIII. In one embodiment, such discernment may be performed with a high-level design language. In certain embodiments, there are additional advantages in the subsequent optimization where the data and control are identified from the original behavioral netlist. Once the data and control elements have been identified, the operations identified in blocks 1016–1068 may be performed by using the syntactic manipulations described above. Thus, at block 1016, connection cells to base Boolean values are removed by incorporating the corresponding functions into the syntactic expressions. Similarly, non-inverting buffers are removed at block 1020 and also incorporated directly into the syntactic expressions. At block 1024, inverters are removed by syntactically inverting the relevant data elements in individual syntactic expressions. The removal of redundant nodes at block 1028 may proceed by reducing, combining, and permuting nodes in the syntactic expressions. Methods for such reductions, combinations, and permutations for certain embodiments were described above in connection with FIGS. 9B and 9C. At block 1032, inversions are removed. The inversions removed may include control/state variable inversions, truth table inversions and buffer inversions, for which methods of removing were described above in connection with FIG. 9A.

A loop comprising blocks 1036 and 1040 may be executed to identify and merge fanout nodes. A "fanout node" describes a configuration in which a single output is directed to multiple parts of truth tables and, in some instances, optimizations may be realized by merging such fanout nodes. A check is first performed at block 1036 to identify whether the ULG netlist includes any fanout nodes, in which case they are reduced at block 1040 by performing permutations and reductions as described in connection with FIG. 9C. The loop between blocks 1036 and 1040 is included because the reductions performed at block 1040 may produce some new fanout nodes that may be identified and merged through additional permutations and reductions. The method thus loops until no fanout nodes are identified at block 1036.

After the fanout nodes have thus been merged, a check is made at block 1044 to identify syntactic expressions corresponding to synchronous cells in which half the truth-table states are low. If such an expression is identified, the corresponding control variable is moved to be a reset input at block 1048. A method for doing so is described in connection with FIG. 9D and may include performing permutations to align the low truth-table states. A similar check is made at block 1052 to identify syntactic expressing corresponding to synchronous cells in which half the truth-table states are high. If such an expression is identified, the corresponding control variable is move to be a set input at block 1056. A method for doing so is also described in connection with FIG. 9D and may include performing permutations to align the high truth-table states.

At block 1060, the syntactic expressions are grouped by common inputs. Such grouping permits identification of subfunctions at block 1064. The common subfunctions have shared characteristics that may be extracted before reducing other nodes. At block 1068, buffers are made to be inverting buffers.

If the original ULG netlist produced at block 1004 was nonoptimal, performing the above manipulations may produce a different ULG netlist that is amenable to implementation with smaller area, greater speed, and/or lower power requirements. In some embodiments, it is possible that not all of the manipulations will be performed, that some may be performed multiple times, and that they may be performed in a different order than described. Once the method has produced a new ULG netlist, it may be implemented at block 1072 by translating the syntactic expressions in the ULG netlist with the cells described above. In such embodiments, the method functions not only to optimize the digital design but also to provide a multiplexor-based implementation of it. In some alternative embodiments, the resulting ULG netlist may be amenable to translation back into the original netlist syntax for implementation using Boolean logic gates. In these embodiments, the method may be viewed as providing an optimization of a digital design while retaining its underlying structural characteristics.

Figure 11:
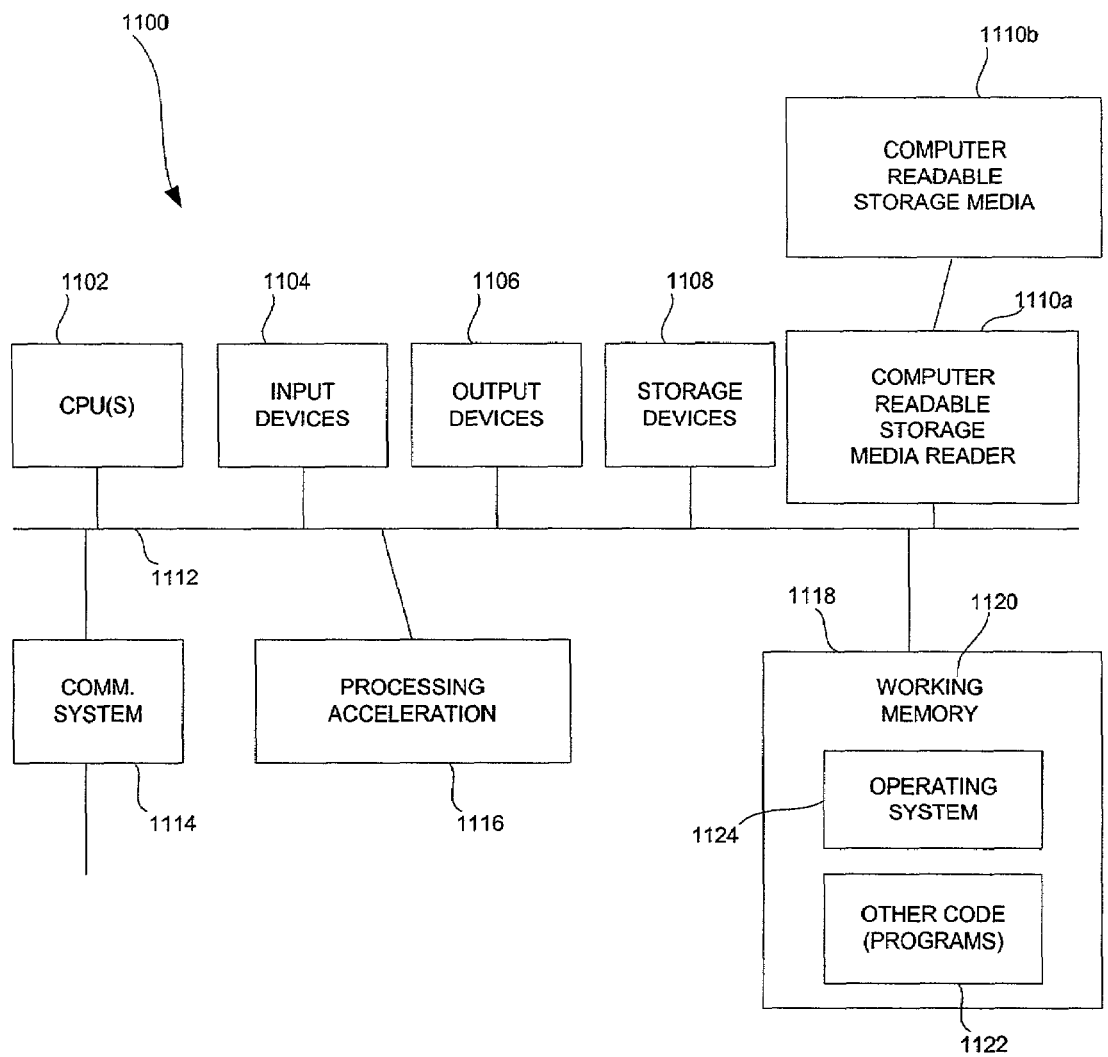
FIG. 11 provides a schematic illustration of a computer system on which methods of the invention may be embodied.

In some embodiments, it is desirable for the techniques used for the syntactic manipulations to be embedded in an optimization tool or synthesizer. Accordingly, the methods of the invention for converting a netlist into a ULG netlist and for optimizing the ULG netlist may be performed by a computer, one example of a suitable configuration for which is shown in FIG. 11. This figure broadly illustrates how individual system elements may be implemented in a separated or more integrated manner. The computer 1100 is shown comprised of hardware elements that are electrically coupled via bus 1112, including a processor 1102, an input device 1104, an output device 1106, a storage device 1108, a computer-readable storage media reader 1110*a*, a communications system 1114, a processing acceleration unit 1116 such as a DSP or special-purpose processor, and a memory 1118. The computer-readable storage media reader 1110*a* is further connected to a computer-readable storage medium 1110*b*, the combination comprehensively representing remote, local, fixed, and/or removable storage devices plus storage media for temporarily and/or more permanently containing computer-readable information. A communications system 1114 may comprise a wired, wireless, modem, and/or other type of interfacing connection.

The computer 1100 also comprises software elements, shown as being currently located within working memory 1120, including an operating system 1124 and other code 1122, such as a program designed to implement optimization methods of the invention. It will be apparent to those skilled in the art that substantial variations may be used in accordance with specific requirements. For example, customized hardware might also be used and/or particular elements might be implemented in hardware, software (including portable software, such as applets), or both. Further, connection to other computing devices such as network input/output devices may be employed.

EXAMPLE

The method described with respect to FIG. 10 was used to optimize a netlist for a microcontroller. A synthesized netlist of commercial library cells was translated to the ULG netlist formalism and optimized by performing the described syntactic manipulations. The size of implementing the optimized ULG netlist with the cells described herein was then compared with the size of the original implementation. The overall size was reduced by about 37%, a significant reduction.

V. Digital Design with Syntactic Manipulation

Figure 12:
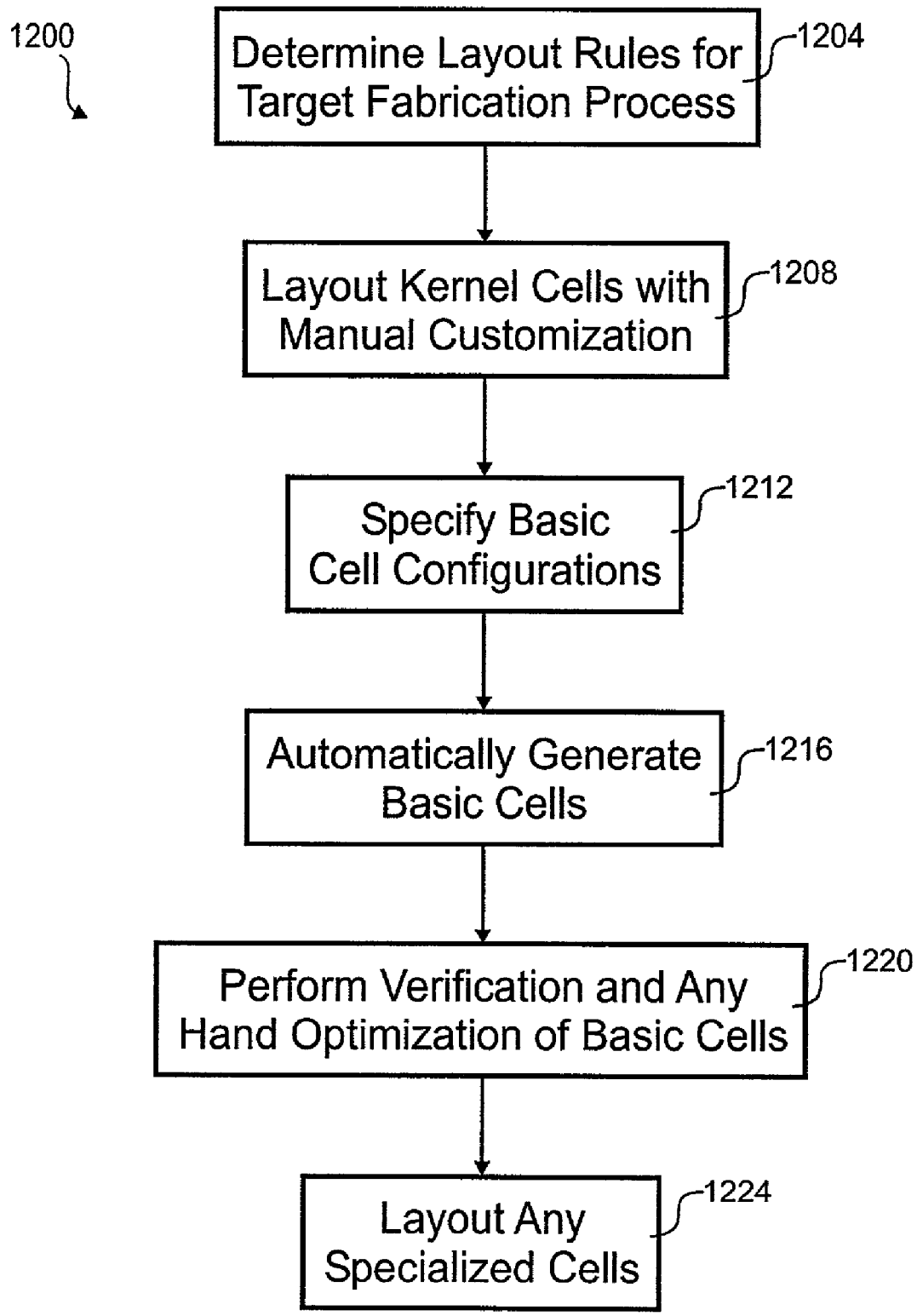
FIG. 12 is a flow diagram of an embodiment of a process for preparing a ULG ASIC cell library.

Referring next to FIG. 12, a flow diagram of an embodiment of a process for preparing a ULG ASIC cell library is shown. In this embodiment, a new fabrication process is being adapted to use the kernel cell/basic cell topology. The depicted portion of the process begins in step 1204 where a layout engineer or technician analyzes the layout rules for the target fabrication process. The fabrication process could have different amounts of metalization layers, different semiconductor compositions, different transistor types, and different topologies such as SOI, etc. that are considered during layout. The kernel cells are laid out, at least partially, by hand to optimize the circuitry in step 1208. Some embodiments could start the kernel cell layout with a computer routed design that is hand-customized. Care is taken to have kernel cells of a consistent height and to adhere to abutment guidelines such that clock signals and some of the I/O are latitudinally aligned. Other embodiments could rely upon autorouting entirely to build the kernel cells.

The kernel cells can be assembled in a number of ways to potentially create hundreds of basic cells 100 in the ULG ASIC cell library. The basic cell configurations are specified in step 1212. This could be done by editing a script fed to the tool that combines the kernel cells into basic cells. In step 1216, the kernel cells are automatically assembled into basic cells 100 in this embodiment. Some embodiments could assemble the kernel cells manually or in-art manually. Once the basic cells are generated, they are verified in step 1220. This verification validates the digital and analog performance of the basic cells. Any problems uncovered in verification can be fixed in the kernel and/or basic cells. To complete the ULG ASIC cell library, any specialized cells are laid-out in step 1224.

In one embodiment, selection logic is used in digital circuits to replace some or all combinatorial logic. A significant proportion of the basic cells use a ULG 104. In contrast, conventional semiconductor circuits do not use ASIC cell libraries that include ULG circuits. In one embodiment, the ULG circuits come in various sizes, that have between two and eight inputs and between one and three select lines.

The extensive use of ULGs or selection circuits in this invention could be characterized in a number of ways in the various embodiments, those characterizations include:

(1) A digital IC design using an ASIC cell library that includes a proportion of cells with selection circuits. In various embodiments, the proportion of the cells with selection circuits in the ASIC cell library could include, for example, 5% or more, 10% or more, 25% or more, 50% or more, 75% or more, 80% or more, 90% or more.

(2) A digital IC design using an ASIC cell library that includes a percentage of basic cells that each include two or more kernel cells. For example, that percentage could be more than 5%, 10%, 20%, 30%, 40%, 50%, 60%, 70%, 80%, or 90%.

(2) A digital design that includes a proportion of selection circuits. Where the proportion is defined in terms of circuit area, power consumption or number of kernel cells. In various embodiments, the proportion of a digital design that includes selection circuits could include 1% or more, 2% or more, 5% or more, 10% or more, 20% or more, 30% or more, 40% or more, or 50% or more.

(3) A digital design implemented in a semiconductor circuit where the digital building blocks include memory cells, one input Boolean operators and selection circuits. The selection circuits are non-Boolean operators and have three or more inputs. In some cases, there could be a small proportion of the digital building blocks could be Boolean operators, such as 1% or less, 2% or less, 5% or less, 10% or less, or 20% or less.

Those digital designs could be embodied in the form of, for example, a structural netlist, a behavioral netlist, a HDL netlist, a full-custom ASIC, a semi-custom ASIC, an IP core circuit, an integrated circuit, a hybrid chip, one or more masks, a FPGA, or a circuit card having a number of integrated circuits. The full-custom and semi-custom ASICs are defined as custom integrated circuits herein and could use at least some standard cells. Structural netlists enumerate low-level cells to use and how they are interconnected. Behavioral netlists have high-level descriptions of the functionality of a circuit similar to high-level programming languages. Case statements, IF-THEN-ELSE statements can be easily translated from behavioral constructs to ULG circuits. Examples of HDL netlists include RTL, VHDL, Verilog and CHDL. The HDL netlists may be high-level behavioral netlists or low-level structural netlists. ASIC designs can be full-custom or semi-custom designs. The full-custom designs have a full set of masks done for each design, whereas the semi-custom designs have some reusable masks that define an array of gates that are custom interconnected with some unique masks. Where a semi-custom ASIC is done, the gates would include ULG circuits. IP core circuits are netlists or maskwork that define a reusable function such as a microprocessor, bus interface, etc. that is typically provided by a third-party vendor. An integrated circuit is simply a semiconductor chip. Where more than one chip is in a package, that package is referred to as a hybrid integrated circuit or multi-chip-module. Circuit cards can couple together a number of integrated circuits soldered thereon, where the integrated circuits use ULGs.

There are several approaches to integrating syntactic manipulation into digital design. In some embodiment, the designer anticipates using syntactic manipulation at the start of the design process. Using HDL constructs, such as case statements, allows easy mapping to the HDL ASIC cell library. Digital designers often mix-and-match tools from several vendors to develop a design flow suited to a particular digital designer. With that in mind, the various below embodiments integrate the concepts of this invention in various ways and to varying degrees. As those skilled in the art can appreciate, the processing of the design can be somewhat automated by using scripts to run the various tools on various design files.

With reference to FIG. 13, a block diagram of an embodiment of a design flow 1300 that uses syntactic manipulation after synthesis is shown. Included in this design flow are an HDL entry tool 1304, a synthesis tool 1308, a conventional cell library 1324, an optimization tool, a static & dynamic timing analysis tool 1316, and a place & route tool 1320. In this embodiment, the digital designer uses all the tools of their normal design flow, but includes the optimization tool 1312 after the synthesis tool 1308. The optimization tool 1312 performs the syntactic manipulation in this design flow.

The HDL entry tool 1304 is a software edit tool that allows the digital designer to enter HDL as a behavioral netlist. The HDL could be VHDL, Verilog or Concise Hardware Description Language (CHDL). CHDL is a HDL that is tuned for the design constructs beneficial for designs with ULG cells. The HDL entry tool 1304 could receive feedback from the other tools to identify portions of the code that have problems found by those other tools. Other design capture tools could be used instead of a HDL entry tool, for example, state machine tools, RTL tools, schematic capture tools, etc. Dynamic timing analysis could be performed on the behavioral netlist to confirm proper functionality.

A behavioral netlist is converted by the synthesis tool 1308 into a structural netlist using the conventional cell library 1324 in this embodiment. The behavioral constructs are converted to Boolean constructs and optimized. From the conventional cell library 1324, cells are used for the optimized Boolean constructs. In some cases, typical timing values are used by the synthesis tool 1308 to identify potential problems in the conversion process using static timing analysis. Dynamic timing analysis could also be performed on the structural netlist to confirm functionality wasn't compromised during the conversion.

The optimization tool 1312 uses syntactic manipulation to improve the design in at least one of the following areas: power consumption, leakage current, fanout, chip area, number of masks, number of process steps, yield, capacitance, inductance, resistance, glitches, etc. In this embodiment, variables can be fed to the optimization tool 1312 in order to set the priorities among these design factors. These variables could be set on a scale of one-to-ten to indicate relative value along a sliding scale.

Some embodiments could optimize for various factors by use of alternative cells in the ULG library. Certain cells could be optimized for various design factors such as power consumption, leakage current, fanout, chip area, number of masks, number of process steps, yield, capacitance, inductance, resistance, glitches, etc. During the optimization, the alternative cells could be used based upon how the digital designer set the priority variables.

In this embodiment, the optimization tool optimizes the structural netlist from the synthesis tool to produce an optimized structural netlist that uses the same conventional cell library 1324. The synthesized structural netlist is read and converted into an intermediate netlist that uses an embodiment of the ULG ASIC cell library. This embodiment of the ULG cell library can be somewhat simplified as the variation used in an ASIC could be unnecessary when only optimizing. Syntactic manipulation is performed upon the intermediate netlist according to the optimization priorities, if specified. Some embodiments could perform a default optimization that may or may not be modifiable by the digital designer. Once the intermediate netlist is optimized, it is converted to an optimized structural netlist that uses the conventional cell library 1324.

Static & dynamic timing analysis is run on the optimized structural netlist. The static timing analysis takes into account timing relationships for the optimized structural netlist and identifies portions of the circuit that may fail to meet the timing requires of the circuit. Parameters can be entered into the synthesis and/or optimization tools 1308, 1312 to prioritize certain portions of the circuit to make meeting static timing requirements easier.

Dynamic timing analysis can come in a few forms. Input waveforms can be designed to stimulate the design, whereafter the digital designer checks for correct output waveforms. To automate this process, test vectors can be developed and applied to the inputs of the circuit whereafter output test vectors are tested against the actual output. Discrepancies are noted as errors and fixed by tweaking the behavioral code and synthesis/optimization tools 1308, 1312 such that errors are not introduced into the process.

Once the digital designer is happy with the structural netlist, the place & route tool 1320 performs a physical layout of the circuit. A location for each cell in the optimized structural netlist is chosen and traces are laid-out to interconnect those cells according to the netlist. These types of tools 1320 are automated or semi-automated. More accurate timing values are available after place & route because the trace lengths interconnecting the cells is known. Further static/dynamic analysis 1316 can be performed to assure that new errors weren't introduced during the place and route process. Once a suitable layout is achieved, masks can be produced and fabrication can start. Dynamic testing on the resulting chip may be performed to test functionality after fabrication.

Referring next to FIG. 14, a block diagram of another embodiment of a design flow 1400 is shown that uses syntactic manipulation and the ULG ASIC cell library. In this embodiment, a ULG cell library 1404 is used during synthesis 1308. By targeting the ULG cell library, the synthesized structural netlist is in a format readily understood by the optimization tool 1312 such that a conversion to an intermediate netlist is unnecessary. The optimization tool 1312 performs the syntactic manipulation before converting from the intermediate format to the conventional cell library 1324. The optimized structural netlist is uses the conventional cell library 1324, which is understood by the place & route tool 1320 and the fab or foundry.

Figure 15:
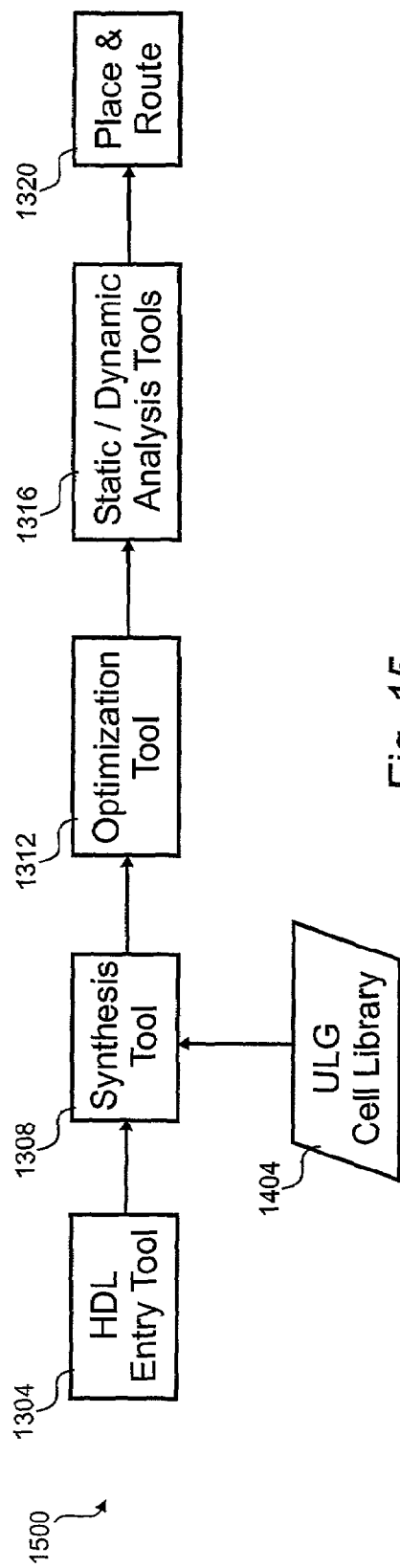
FIG. 15 is a block diagram of another embodiment of a design flow that uses the ULG ASIC cell library for the final netlist.

With reference to FIG. 15, a block diagram of another embodiment of a design flow 1500 is shown that uses the ULG ASIC cell library 1404 for the final netlist used by the fab or foundry. In this embodiment, the ULG ASIC cell library 1404 has been produced for the target process at the fab or foundry. The synthesis tool 1308 converts the behavioral netlist into a synthesized structural netlist that uses the ULG ASIC cell library 1404. The optimization tool can process the netlist without any conversion between cell libraries such that the resulting optimized structural netlist also uses the ULG ASIC cell library.

Figure 16:
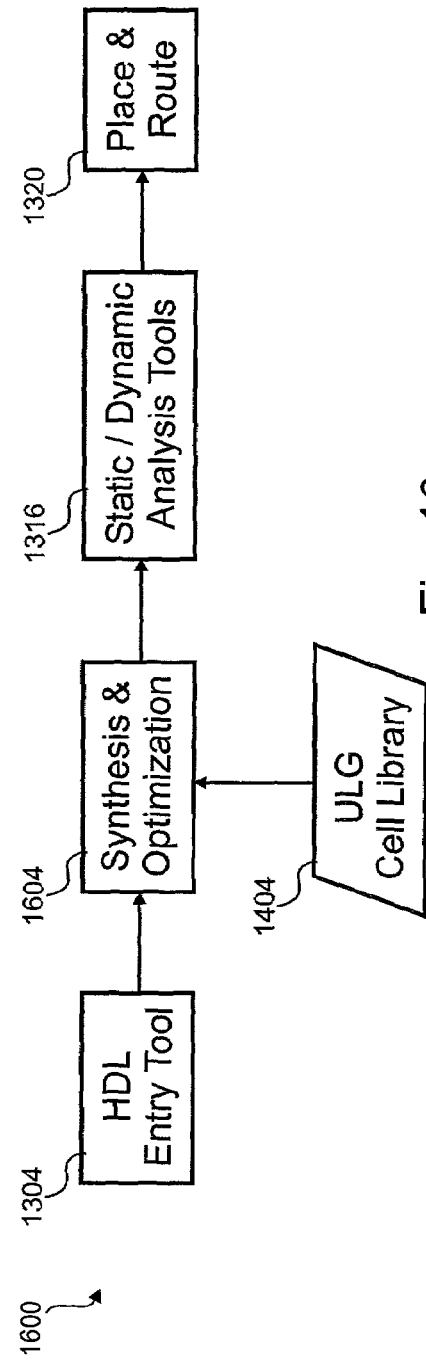
FIG. 16 is a block diagram of yet another embodiment of a design flow that combines synthesis and syntactic manipulation into a single tool.

Referring next to FIG. 16, a block diagram of yet another embodiment of a design flow 1600 is shown that combines synthesis and syntactic manipulation into a single tool 1604. The synthesis & optimization tool 1604 takes the behavioral netlist from the HDL entry tool 1304 and converts it to an intermediate structural netlist using the ULG ASIC cell library 1404. The intermediate structural netlist is optimized using syntactic manipulation with the tool 1604 to produce an optimized structural netlist that uses the ULG cell library 1404. In this embodiment, the HDL entry tool 1304 uses CHDL.

In some embodiments, the synthesis & optimization tool 1604 may not have a ULG cell library 1404 for the target ASIC process. In that case, the synthesis & optimization tool 1604 would convert the intermediate netlist to an optimized netlist using the conventional cell library 1324.

Figure 17:
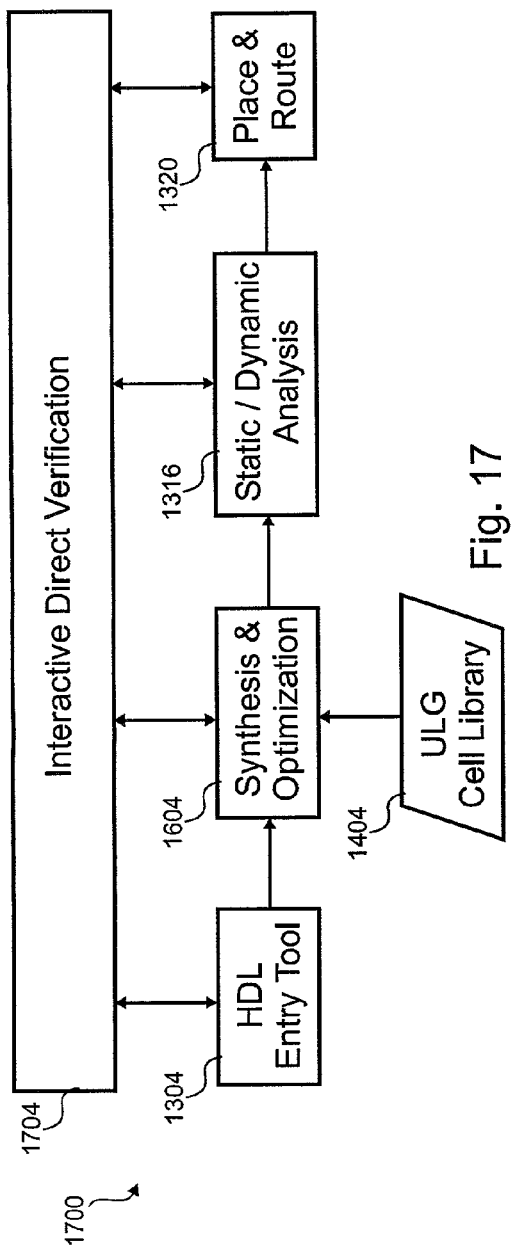
FIG. 17 is a block diagram of still another embodiment of a design flow that uses a verification tool throughout the design flow.

With reference to FIG. 17, a block diagram of still another embodiment of a design flow 1700 is shown that uses an interactive direct verification tool 1704 throughout the design flow 1700. Verification allows debugging a digital design throughout the design flow. In this embodiment, the interactive direct verification tool 1704 tracks the evolution of the design from a behavioral netlist through to a structural netlist that has been placed and routed. The HDL entry tool uses CHDL and the design flow uses the ULG cell library 1504 for the target fabrication process. The various forms of the design embodied in the evolving netlist are accessible to the interactive direct verification tool 1704.

Any identified portion of the circuit can be traced through the various steps of the design flow 1700 using the interactive direct verification tool. For example, a case statement in the CHDL behavioral code can be followed through to the various structural netlists to see how that case statement was implemented. Conversely, a portion of a structural netlist can be followed back to preceding structural netlists or even the behavioral netlist.

Figure 18:
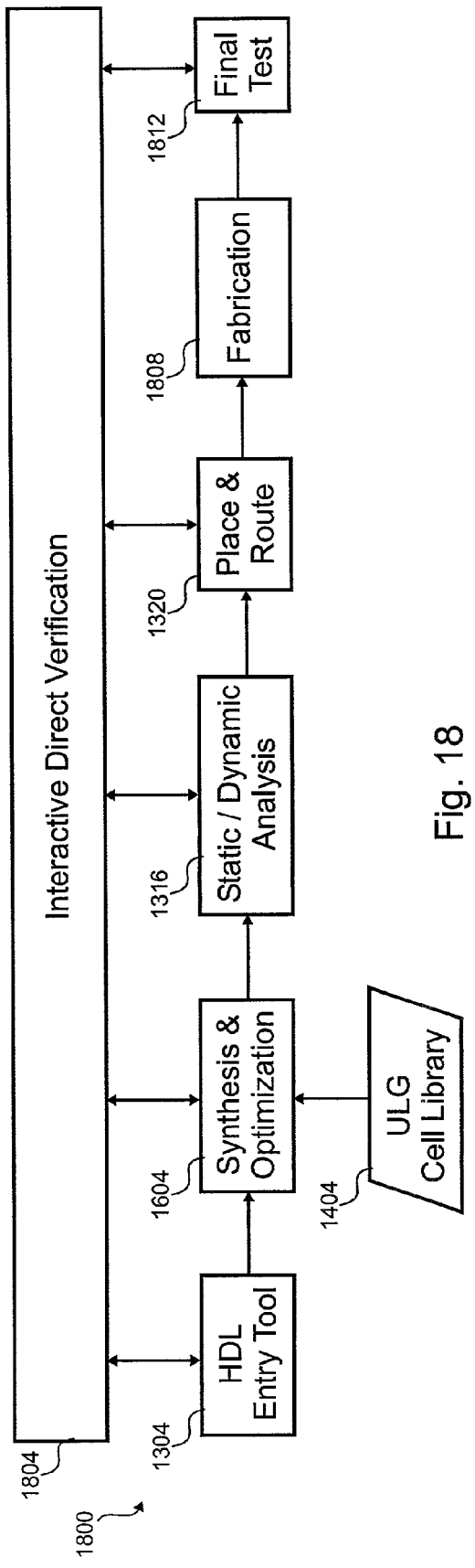
FIG. 18 is a block diagram of still another embodiment of a design flow that uses a verification tool throughout the design flow and after fabrication.

Referring next to FIG. 18, a block diagram of still another embodiment of a design flow 1800 is shown that uses an interactive direct verification tool 1804 throughout the design flow and after fabrication. This embodiment shows the fabrication 1808 and final test 1812 in the design flow. The fabrication 1808 is performed after the design is thoroughly tested. After production, the chips can be tested again. Test vectors are applied to the chip inputs and scan ports in the dynamic analysis in final test 1812. Where an error can be isolated to a pin or node in final test 1812, the interactive direct verification tool 1804 can show the engineer the progression of the design that relates to that failure.

Figure 19:
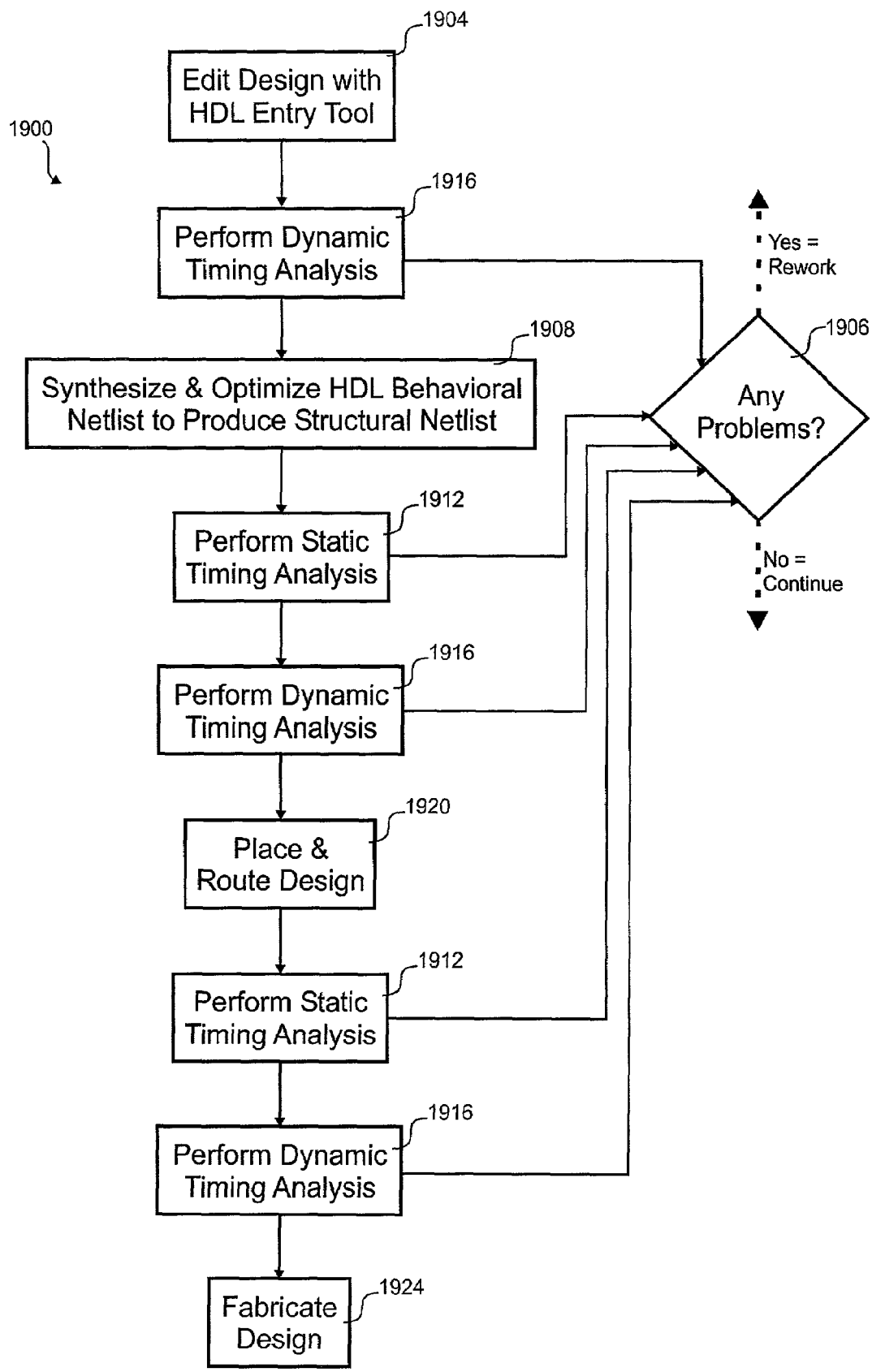
FIG. 19 is a flow diagram of an embodiment of a design process.

With reference to FIG. 19, a flow diagram of an embodiment of a design process 1900 is shown. In the depicted portion of the design process 1900, the sequential steps are show along with the test and rework steps. In step 1904, the digital design is entered using an entry tool. A HDL such as Verilog, VHDL or CHDL is used to enter the behavioral netlist for the circuit being designed. Throughout the design entry phase, dynamic timing analysis is performed in step 1916 to verify that the behavioral netlist is probably being prepared correctly. At this stage, the dynamic timing analysis is probably done in a waveform simulation tool. Various scenarios are designed with the simulation tool to test various conditions of the digital design. During the timing analysis of step 1916, problems could be found in step 1906. Rework of the behavioral code could be performed by returning to step 1904 where problems are found. Processing continues from step 1916 to step 1908 where no problems are found.

Synthesis and optimization is performed in step 1908 to convert the behavioral netlist to an optimized structural netlist. Conversion between cell libraries can also be performed in this step. Some embodiments may perform the synthesis and optimization as separate steps. Static and dynamic timing analysis are performed in steps 1912 and 1916. If problems are found, rework may be done in step 1904 or step 1908. Rework in step 1908 could include changing parameters fed to the synthesis & optimization tool 1604 or correcting problems with libraries.

Once generally satisfied with the optimized structural netlist, processing continues to step 1920 for place & route of the design. In this step, the trace lengths and drive requirements are more accurately analyzed to improve the verification that can be performed on the digital design. Once again static and dynamic timing analysis is performed in step 1912 and 1916 to verify the laid-out design still behaves properly. Where there are problems as detected in step 1906, rework could be performed in steps 1904, 1908 or 1920. The interactive direct verification tool 1804 can assist the digital designer find where flaws were likely introduced into the netlist. Where there are no problems after layout, the design is fabricated in step 1924.

Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A method for optimizing an application specific integrated circuit, the method comprising:
   translating a first representation of a digital design for the application specific integrated circuit to a second representation of the digital design, the second representation comprising a plurality of syntactic expressions that admit a representation of a higher-order function of base Boolean values; and
   manipulating the plurality of syntactic expressions to form a third representation of the digital design.

2. The method recited in claim 1 further comprising identifying data and control in the second representation.

3. The method recited in claim 2 wherein manipulating the plurality of syntactic expressions comprises reassigning data and control.

4. The method recited in claim 3 wherein manipulating the plurality of syntactic expressions comprises assigning a control variable for at least one of the syntactic expressions as a flip-flop input to such syntactic expression.

5. The method recited in claim 1 further comprising identifying data and control in the first representation.

6. The method recited in claim 1 further comprising translating the third representation of the digital design to a fourth representation of the digital design, wherein the first and fourth representations are expressed within the same syntax.

7. The method recited in claim 6 wherein the first and fourth representations comprise netlists.

8. The method recited in claim 7 wherein the first and fourth representations identify Boolean logic elements for implementing the digital design.

9. The method recited in claim 1 wherein the second and third representations identify sets of cell elements that comprise multiplexors for implementing the digital design.

10. The method recited in claim 9 wherein at least one of the multiplexors comprises a depletion-mode transistor.

11. The method recited in claim 1 wherein manipulating the plurality of syntactic expressions comprises removing logical inversions within the syntactic expressions.

12. The method recited in claim 1 wherein manipulating the plurality of syntactic expressions comprises reducing a number of nodes within the syntactic expressions.

13. The method recited in claim 12 wherein at least one of the nodes comprises a fanout node.

14. A method for optimizing a digital design, the method comprising:
   translating a first representation of the digital design to a second representation of the digital design, the second representation comprising a plurality of syntactic expressions, wherein at least 20% of the syntactic expressions identify a higher-order function of base Boolean values;
   identifying data and control in at least one of the first and second representations; and
   manipulating the plurality of syntactic expressions to form a third representation of the digital design.

15. The method recited in claim 14 wherein a majority of the syntactic expressions identify higher-order functions of base Boolean values.

16. The method recited in claim 14 further comprising translating the third representation of the digital design to a fourth representation of the digital design, wherein the first and fourth representations comprise netlists.

17. The method recited in claim 14 wherein the second and third representations identify sets of cell elements that comprise multiplexors for implementing the digital design.

18. The method recited in claim 14 wherein manipulating the plurality of syntactic expressions comprises removing logical inversions within the syntactic expressions.

19. The method recited in claim 14 wherein manipulating the plurality of syntactic expressions comprises reducing a number of nodes within the syntactic expressions.

20. A computer-readable storage medium having a computer-readable program embodied therein for directing operation of a computer system including a processor and at least one input device, wherein the computer-readable program includes instructions for operating the computer system for optimizing a digital design in accordance with the following:
   receiving a first representation of the digital design from the at least one input device;
   translating the first representation of the digital design to a second representation of the digital design, the second representation comprising a plurality of syntactic expressions that admit a representation of a higher-order function of base Boolean values; and
   manipulating the plurality of syntactic expressions to form a third representation of the digital design.

21. The computer-readable storage medium recited in claim 20 wherein the computer-readable program further includes instructions for translating the third representation of the digital design to a fourth representation of the digital design, wherein the first and fourth representations comprise netlists.

22. The computer-readable storage medium recited in claim 21 wherein the first and fourth representations identify sets of cell elements that comprise multiplexors for implementing the digital design.

23. The computer-readable storage medium recited in claim 20 wherein the second and third representations identify sets of cell elements that comprise multiplexors for implementing the digital design.

24. The computer-readable storage medium recited in claim 20 wherein manipulating the plurality of syntactic expressions comprises removing logical inversions within the syntactic expressions.

25. The computer-readable storage medium recited in claim 20 wherein manipulating the plurality of syntactic expressions comprises reducing a number of nodes within the syntactic expressions.

26. The computer-readable storage medium recited in claim 20 wherein the computer-readable program further includes instructions for identifying data and control in the second representation.

27. The computer-readable storage medium recited in claim 20 wherein manipulating the plurality of syntactic expressions comprises reassigning data and control.

28. The computer-readable storage medium recited in claim 20 wherein:
   the computer-readable program further includes instructions for receiving commands from the at least one input device; and
   manipulating the plurality of syntactic expressions to form the third representation of the digital design is performed in accordance with the commands.

* * * * *

UNITED STATES PATENT AND TRADEMARK OFFICE
CERTIFICATE OF CORRECTION

| | | |
|---|---|---|
| PATENT NO. | : 6,993,731 B2 | Page 1 of 1 |
| APPLICATION NO. | : 10/172746 | |
| DATED | : January 31, 2006 | |
| INVENTOR(S) | : Whitaker et al. | |

It is certified that error appears in the above-identified patent and that said Letters Patent is hereby corrected as shown below:

In Column 1, Line 33, insert paragraph as follows:

--STATEMENTS AS TO RIGHTS TO INVENTIONS MADE UNDER FEDERALLY SPONSORED RESEARCH AND DEVELOPMENT

This invention was supported by U.S. Government under an award by NASA under Grant No. NAGS-9152, which outlines certain rights in the invention given to the U.S. Government.--

Signed and Sealed this

Sixth Day of November, 2007

JON W. DUDAS
*Director of the United States Patent and Trademark Office*